US010255863B2

(12) United States Patent
Song et al.

(10) Patent No.: US 10,255,863 B2
(45) Date of Patent: Apr. 9, 2019

(54) DISPLAY PANEL HAVING A FIRST REGION, A SECOND REGION, AND A THIRD REGION BETWEEN THE FIRST AND SECOND REGIONS AND INCLUDING A DRIVE PORTION ON THE THIRD REGION

(71) Applicant: SAMSUNG DISPLAY CO., LTD., Yongin, Gyeonggi-Do (KR)

(72) Inventors: Myoung Seop Song, Asan-si (KR); Jong Soo Kim, Hwaseong-si (KR); Myung Ho Lee, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 118 days.

(21) Appl. No.: 14/658,116

(22) Filed: Mar. 13, 2015

(65) Prior Publication Data
US 2015/0287365 A1 Oct. 8, 2015

(30) Foreign Application Priority Data

Apr. 2, 2014 (KR) .......................... 10-2014-0039399
Dec. 31, 2014 (KR) .......................... 10-2014-0194760

(51) Int. Cl.
*G06F 3/038* (2013.01)
*G09G 5/00* (2006.01)
(Continued)

(52) U.S. Cl.
CPC ............. *G09G 3/344* (2013.01); *G09F 9/301* (2013.01); *G09G 3/20* (2013.01); *G09G 3/3208* (2013.01);
(Continued)

(58) Field of Classification Search
None
See application file for complete search history.

(56) References Cited

U.S. PATENT DOCUMENTS

2002/0071066 A1* 6/2002 Silverbrook ......... B41J 2/14427
349/58
2005/0219150 A1* 10/2005 Park ...................... G06F 3/1431
345/4
(Continued)

FOREIGN PATENT DOCUMENTS

JP 2013015727 A * 1/2013
KR 10-2005-0073262 A 7/2005
(Continued)

OTHER PUBLICATIONS

Merriam-Webster Online Dictionary definition of via, https://www.merriam-webster.com/dictionary/via, p. 1.*
(Continued)

*Primary Examiner* — Abdul-Samad A Adediran
*Assistant Examiner* — Kirk W Hermann
(74) *Attorney, Agent, or Firm* — Lewis Roca Rothgerber Christie LLP

(57) ABSTRACT

A flexible display panel having a first region, a second region, and a third region between the first region and the second region, the display panel including a first display portion on the first region and configured to display a first image, a second display portion on the second region and configured to display a second image, and a first drive portion on the third region and configured to drive at least one of the first display portion and the second display portion.

10 Claims, 23 Drawing Sheets

(51) Int. Cl.
*G09G 3/34* (2006.01)
*G09F 9/30* (2006.01)
*G09G 3/3208* (2016.01)
*G09G 3/36* (2006.01)
*G09G 3/20* (2006.01)
*G02F 1/1333* (2006.01)

(52) U.S. Cl.
CPC ............ *G09G 3/3611* (2013.01); *G02F 2001/133391* (2013.01); *G09G 2300/026* (2013.01); *G09G 2300/0408* (2013.01); *G09G 2310/0221* (2013.01); *G09G 2310/0267* (2013.01); *G09G 2330/021* (2013.01); *G09G 2380/02* (2013.01); *H01L 2227/323* (2013.01); *H01L 2251/5338* (2013.01)

(56) References Cited

U.S. PATENT DOCUMENTS

| | | | | |
|---|---|---|---|---|
| 2006/0279512 | A1* | 12/2006 | Kim | G09G 3/3677 345/100 |
| 2007/0196576 | A1* | 8/2007 | Kim | C23C 16/24 427/255.28 |
| 2008/0259010 | A1* | 10/2008 | Ma | G09G 3/3674 345/87 |
| 2009/0172532 | A1* | 7/2009 | Chaudhri | G06F 3/0482 715/702 |
| 2010/0207848 | A1* | 8/2010 | Cok | G09G 3/2085 345/76 |
| 2010/0265224 | A1 | 10/2010 | Cok | |
| 2011/0291923 | A1* | 12/2011 | Tong | G06F 1/1652 345/156 |
| 2012/0014054 | A1* | 1/2012 | Ashcraft | G06F 1/1626 361/679.26 |
| 2012/0075268 | A1* | 3/2012 | Chung | G02F 1/13452 345/204 |
| 2012/0194773 | A1* | 8/2012 | Kim | G02F 1/3336 349/139 |
| 2013/0221840 | A1* | 8/2013 | Oh | H01L 51/5237 313/511 |
| 2013/0335665 | A1* | 12/2013 | Tseng | G02F 1/13306 349/43 |
| 2014/0063392 | A1 | 3/2014 | Gondo | |
| 2014/0065326 | A1* | 3/2014 | Lee | G06F 1/16 428/12 |
| 2015/0022436 | A1* | 1/2015 | Cho | G06F 1/1652 345/156 |
| 2015/0049428 | A1* | 2/2015 | Lee | G06F 1/1641 361/679.27 |
| 2015/0364396 | A1* | 12/2015 | Asai | G02F 1/13336 257/43 |

FOREIGN PATENT DOCUMENTS

| | | | |
|---|---|---|---|
| KR | 10-2011-0061423 A | | 6/2011 |
| KR | 1020110061423 | * | 6/2011 |
| KR | 10-2013-0007311 A | | 1/2013 |
| KR | 1020130007311 A | * | 1/2013 |
| KR | 10-2013-0068561 A | | 6/2013 |

OTHER PUBLICATIONS

EPO Search Report dated Sep. 22, 2015, for corresponding European Patent application 15162271.9, (8 pages).

* cited by examiner

D(D1, D2, D3)
N(N1, N2, N3, N4)

ical Property Office, and
DISPLAY PANEL HAVING A FIRST REGION, A SECOND REGION, AND A THIRD REGION BETWEEN THE FIRST AND SECOND REGIONS AND INCLUDING A DRIVE PORTION ON THE THIRD REGION

CROSS-REFERENCE TO RELATED APPLICATION

This application claims priority to and the benefit of Korean Patent Application No. 10-2014-0039399, filed on Apr. 2, 2014 in the Korean Intellectual Property Office, and Korean Patent Application No. 10-2014-0194760, filed on Dec. 31, 2014 in the Korean Intellectual Property Office, the disclosures of which are incorporated herein in their entirety by reference.

BACKGROUND

1. Field

Aspects of embodiments of the present invention relate to a display panel, and more particularly, to a flexible display panel.

2. Description of the Prior Art

Recently, flat display devices, such as liquid crystal display (LCD) devices, plasma display panels (PDP), and organic light emitting display devices, have been mainly used as display devices.

Recently, with the development and popularization of electronic devices, flexible display devices have been developed in addition to the adoption of touch screens in display devices. The flexible display device has been spotlighted as new technology in the display device fields. The flexible display device is divided into a main display region and an auxiliary display region based on (e.g., about) a bent region (e.g., a bendable region). The main display region and the auxiliary display region of the flexible display device may display one image as a whole or may respectively display separate images.

SUMMARY

In a flexible display device, a drive portion to drive the respective display regions may be positioned on one side of the flexible display device. The drive portion drives both the main display region and the auxiliary display region. That is, even when an image is displayed on the main display region only, the drive portion supplies signals to both the main display region and the auxiliary display region. In this case, black image data is supplied to the auxiliary display region and, thus, power consumption is increased. Further, as a signal that is output from the drive portion that is positioned on one side of the display device travels to the other side thereof, signal attenuation may occur, and this may cause the display quality to deteriorate.

Accordingly, one aspect to be improved by the present invention is to provide a display panel which can reduce power consumption and improve the display quality.

Another aspect to be improved by the present invention is to provide a display device including a display panel which can reduce power consumption and improve the display quality.

Additional features, aspects, and characteristics of the invention will be set forth, in part, in the description which follows and, in part, will become apparent to those having ordinary skill in the art upon examination of the following or may be learned from practice of the invention.

In one embodiment of the present invention, there is provided a display panel comprising: a flexible substrate having a first region, a second region, and a third region between the first region and the second region, a first display portion on the first region and configured to display a first image, a second display portion on the second region and configured to display a second image, and a first drive portion on the third region and configured to drive at least one of the first display portion and the second display portion.

The first drive portion may be a scan drive portion that is configured to provide scan signals to the first display portion and the second display portion, respectively.

The flexible substrate may have a non-display region at an outer region of the first region and the second region.

The display panel may further include a driver IC on the non-display region and configured to provide data voltages to the first display portion and the second display portion; and a pad portion configured to provide a control signal and a scan control signal to the driver IC and the scan drive portion.

The display panel may further include a second drive portion on a non-display region that is at an outer region of the first region and the second region, and the first drive portion may be configured to drive the first display portion, and the second drive portion may be configured to drive the second display portion.

The display panel may further include a scan signal control portion configured to provide at least one of a first scan selection signal and a second scan selection signal to the scan drive portion.

The scan drive portion may include a plurality of first transistors respectively coupled to a plurality of scan lines in the first display portion and a plurality of second transistors respectively coupled to a plurality of scan lines in the second display portion, wherein the plurality of first transistors are turned on in response to the first scan selection signal, and the plurality of second transistors are turned on in response to the second scan selection signal.

The first display portion and the second display portion may each include a plurality of display elements in a matrix form, and the scan drive portion may be coupled to each of the plurality of display elements to provide scan signals and may further include a buffer portion configured to amplify the scan signals.

The first region may be substantially planar, and the second region may have a curved surface that is bent along a curvature.

The first region and the second region may be substantially planar.

The third region may be on opposite sides of the first region, and the second region may be on the opposite sides of the first region.

The flexible substrate may be bent such that portions of the second region face each other.

In another embodiment of the present invention, there is provided a display panel including: a substrate having a first region, a second region bent with respect to the first region, and a third region between the first region and the second region, a first display portion on the first region and configured to display a first image, a second display portion on the second region and configured to display a second image, and a first drive portion on the third region and configured to drive at least one of the first display portion and the second display portion.

The first drive portion may be a scan drive portion that is configured to provide scan signals to the first display portion and the second display portion, respectively.

The third region may be flexible.

The first region and the second region may be flexible.

The display panel may further include a second drive portion on a non-display region at an outer region of the first region and the second region, wherein the first drive portion may be configured to drive the first display portion, and the second drive portion may be configured to drive the second display portion.

The second region may be bent with respect to the first region.

In another embodiment of the present invention, there is provided a display panel including: a substrate having a first region, a second region, and a flexible third region between the first region and the second region, a first display portion on the first region and configured to display a first image, a second display portion on the second region and configured to display a second image, and a first drive portion on the third region and configured to drive at least one of the first display portion and the second display portion.

The first drive portion may be a scan drive portion that is configured to provide scan signals to the first display portion and the second display portion, respectively.

The substrate may further include a second drive portion on a non-display region that is at an outer region of the first region and the second region, and wherein the first drive portion may be configured to drive the first display portion, and the second drive portion may be configured to drive the second display portion.

According to embodiments of the present invention, at least the following effects can be achieved.

Because the drive portion can be formed on a part of the display region, the size of the non-display region can be reduced, and thus, a relatively narrow bezel can be provided.

Further, because the transmission distance of the scan signal is reduced, the signal transmission distance in which the scan signal is attenuated can be reduced, and thus, attenuation of the scan signal can be reduced or prevented.

Further, because the display regions can be individually driven, power consumption can be reduced.

The aspects of the present invention are not limited to those exemplified above, and further various aspects and effects are included in the description.

BRIEF DESCRIPTION OF THE DRAWINGS

The above and other features, aspects, and characteristics of the present invention will be more apparent from the following detailed description taken in conjunction with the accompanying drawings, in which.

DETAILED DESCRIPTION

Figure 1:
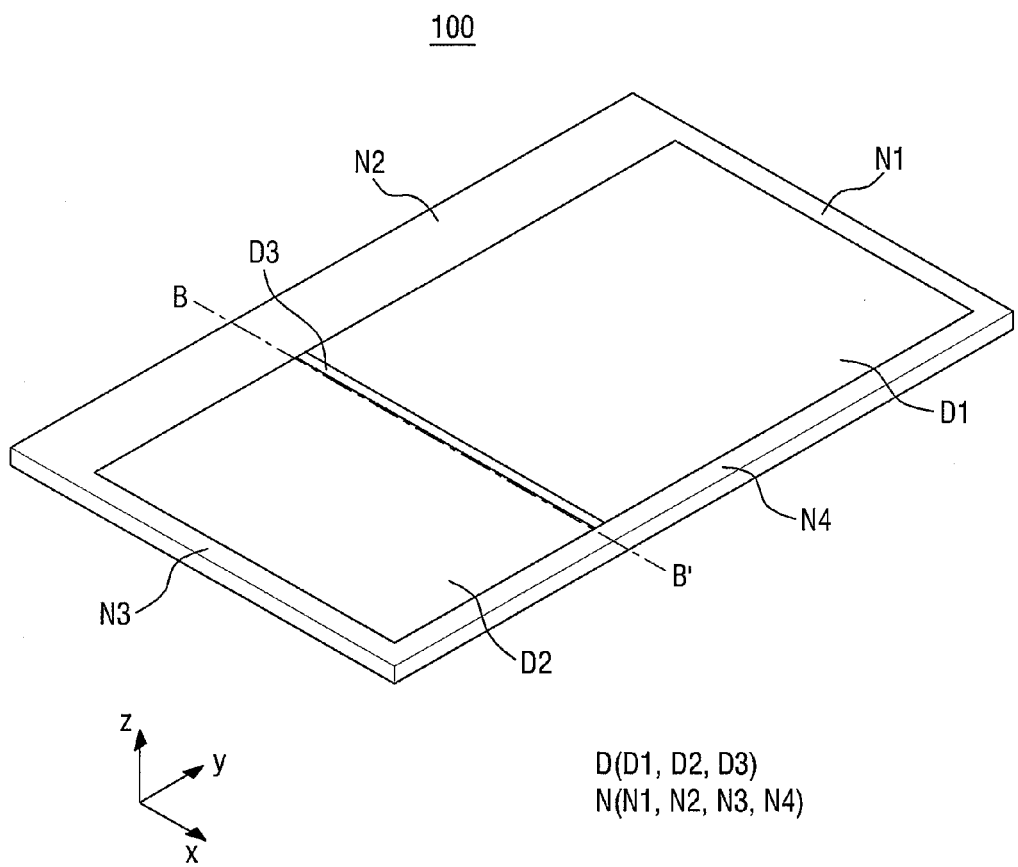
FIG. 1 is a perspective view schematically illustrating a display panel according to an embodiment of the present invention.

The aspects and features of the present invention and methods for achieving the aspects and features will be apparent by referring to the embodiments to be described in detail with reference to the accompanying drawings. However, the present invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the present invention is defined within the scope of the appended claims and their equivalents.

It will be understood that when an element or layer is referred to as being "on", "connected to", or "coupled to" another element or layer, it may be directly on, connected, or coupled to the other element or layer or one or more intervening elements or layers may also be present. When an element is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. The same reference numerals designate the same elements. In the entire description of the present invention, the same drawing reference numerals are used for the same elements across various figures.

Although the terms "first," second," and so forth are used to describe diverse constituent elements, such constituent elements are not limited by the terms. The terms are used only to discriminate a constituent element from other constituent elements. Accordingly, in the following description, a first constituent element may be a second constituent element and vice versa. As used herein, the term "and/or" includes any and all combinations of one or more of the associated listed items. Further, the use of "may" when describing embodiments of the present invention relates to "one or more embodiments of the present invention". Expression, such as "at least one of," when preceding a list of elements, modify the entire list of elements and do not modify the individual elements of the list. Also, the term "exemplary" is intended to refer to an example or illustration.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly. As used herein, the terms "use," "using," and "used" may be considered synonymous with the terms "utilize," "utilizing," and "utilized," respectively.

The terminology used herein is for the purpose of describing particular example embodiments only and is not intended to be limiting of example embodiments. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, embodiments of the present invention will be described with reference to the drawings.

Figure 2:
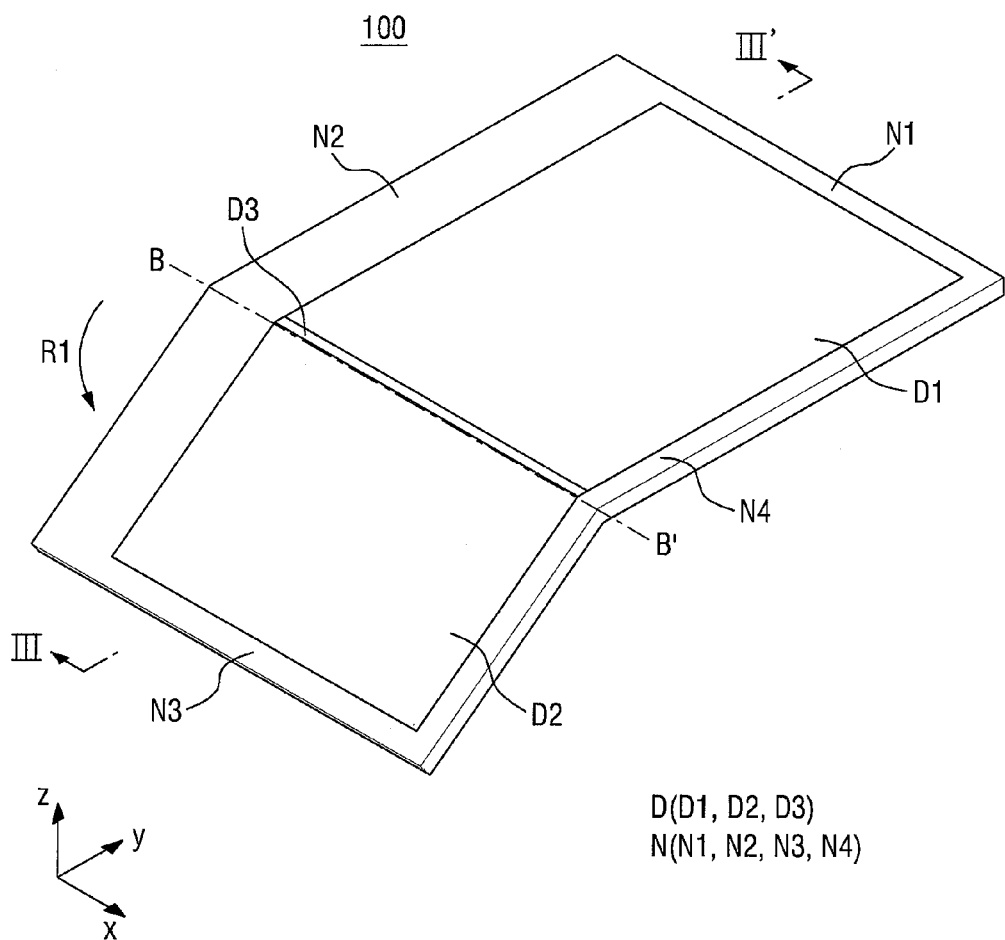
FIGS. 2 and 3 are perspective views illustrating the display panel that is bent along the line B-B' of FIG. 1.
Figure 3:
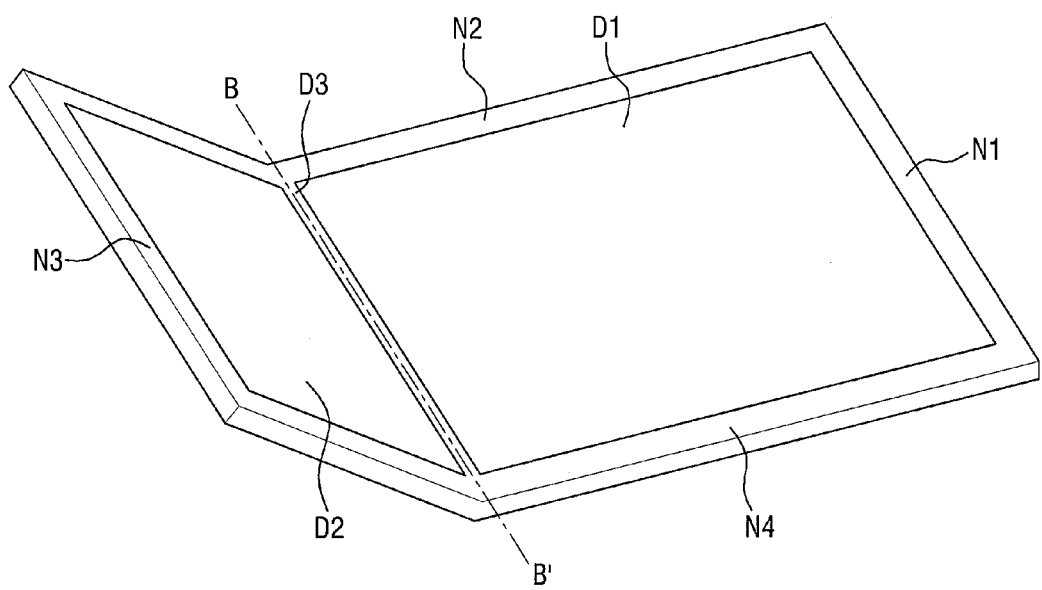
Figure 4:
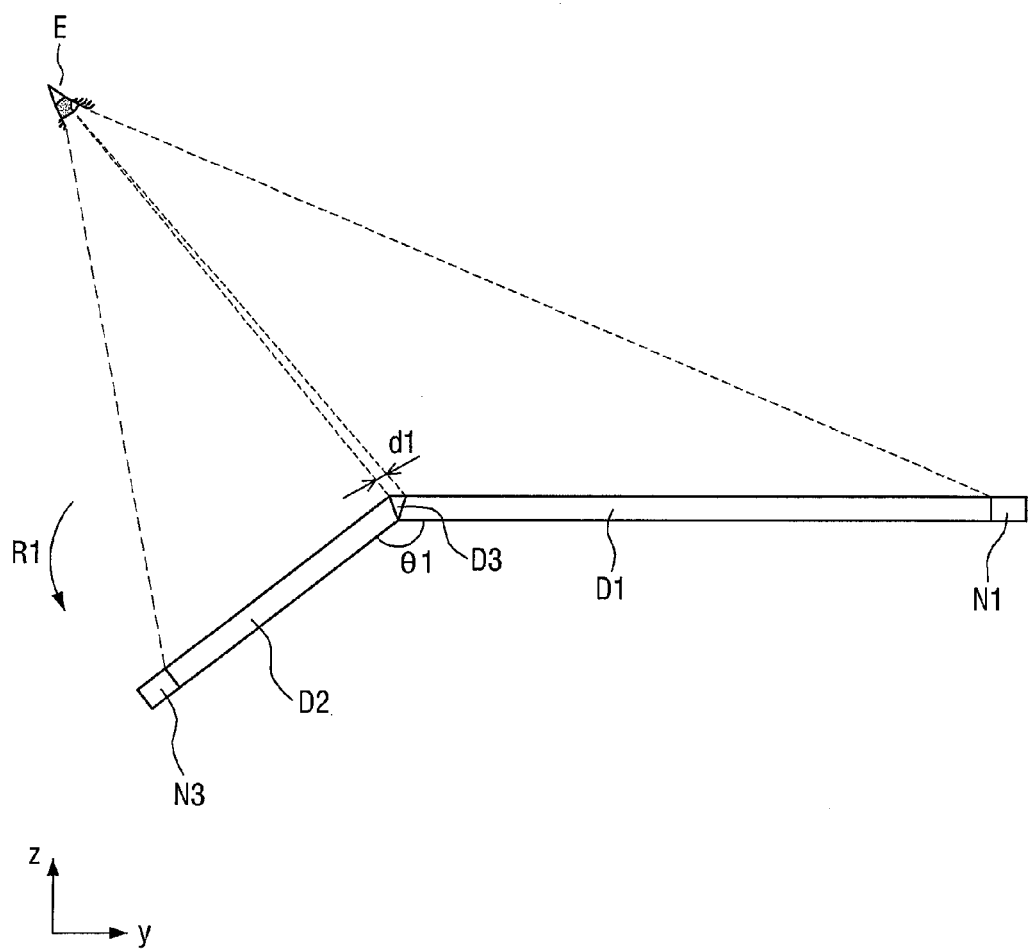
FIG. 4 is a cross-sectional view of the display panel shown in FIG. 2.
Figure 5:
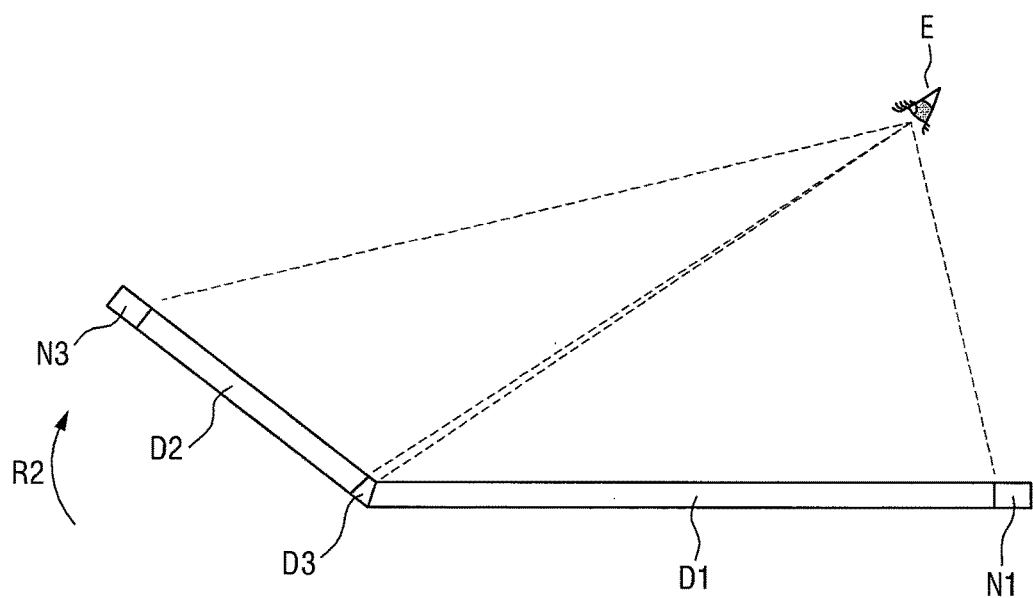
FIG. 5 is a cross-sectional view of the display panel shown in FIG. 3.
Figure 5:
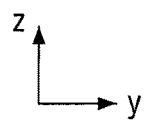

FIG. 1 is a perspective view schematically illustrating a display panel according to an embodiment of the present invention. FIGS. 2 and 3 are perspective views illustrating the display panel that is bent along the line B-B' of FIG. 1, and FIG. 4 is a cross-sectional view of the display panel shown in FIG. 2. FIG. 5 is a cross-sectional view of the display panel shown in FIG. 3.

Referring to FIGS. 1 to 5, a display panel 100 includes a substrate including a first region D1, a second region D2, and a third region D3.

In this embodiment, each of the first region D1 and the second region D2 may be a region in which an image is displayed. For example, a first display portion may be located in the first region D1 and a second display portion may be located in the second region D2. The first region D1 and the second region D2 may each include a plurality of display elements which are turned on sequentially to represent (e.g., display) brightness corresponding to the data voltage applied thereto. The first region D1 may be a main display screen of a display region D, and the second region D2 may be an auxiliary display screen of the display region D, but are not limited thereto. The first region D1 and the second region D2 may display one image as a whole, but are not limited thereto. The first region D1 and the second region D2 may display different images.

The third region D3 may be formed between the first region D1 and the second region D2. The third region D3 may extend in a first direction X to couple (e.g., connect) one end of the first region D1 to one end of the second region D2. For example, the second region D2 may be positioned to continue the first region D1 through the third region D3. The second region D2, the third region D3, and the first region D1 may be arranged sequentially along a second direction Y that crosses (e.g., is perpendicular to) the first direction X.

The substrate of the display panel 100 may be in a folded state. For example, in the first region D1 and the second region D2, the directions of displayed images may be different from each other. That is, the second region D2 may be folded to be orientated in a different direction than the first region D1. In this embodiment, the first region D1 and the second region D2 may be folded with respect to the third region D3. The second region D2 may be in a bent state along a bending line B-B' that is formed at one side of the third region D3. The second region D2 may be folded in a direction different from an orientation direction of the first region D1. The second region D2 may be folded with respect to the first region D1. The bending direction of the second region D2 may be a counterclockwise direction R1 as shown in FIG. 2, but it is not limited thereto. The bending direction of the second region D2 may be a clockwise direction R2 (e.g., opposite to the counterclockwise direction R1). As shown in FIGS. 3 and 5, the second region D2 may be bent in an upward direction with respect to the first region D1. For example, the third region D3 may be a region connecting the first region D1 and the second region D2 which display images in different directions. The first region D1 and the second region D2 may be substantially planar. Accordingly, the second region D2 that is bent to an extent in the counterclockwise direction R1 may form an internal angle θ1 with the first region D1. The internal angle θ1 between the first region D1 and the second region D2 may be reversely proportional to a distance d1 of an external curved surface of the third region D3. That is, as the internal angle θ1 becomes smaller, the distance d1 of the external curved surface may increase. The distance d1 of the external curved surface may be a cross-sectional region of the third region D3 and may be a region in which the drive portion, to be further described later, is mounted. The distance d1 of the external curved surface of the third region D3 and the internal angle θ1 may be preset in consideration of bending stresses of the first region D1 and the second region D2. The display panel 100 according to this embodiment includes the second region D2 that extends from the first region D1 that is the main display region, and thus, a wider image or various images can be provided to a user.

In this embodiment, the substrate of the display panel 100 may include a flexible material. For example, the substrate at the third region D3 may include a flexible material. That is, with respect to the third region D3, the first region D1 and the second region D2 may be transformed into a state opposite to the currently folded state (e.g., a flat state). However, without being limited thereto, the substrate of the display panel 100 may be formed of a flexible material. That is, all of the first region D1, the second region D2, and the third region D3 may be flexible. In this embodiment, the third region D3 may be a region that is bent more frequently than the first region D1 and the second region D2 and may be formed of a more flexible material than that of the first region D1 and the second region D2.

The third region D3 may correspond to a bent portion of the flexible display panel and may be an invisible region that is not recognized by (e.g., visible to) a user's eye E. For example, the third region D3 may correspond to a boundary region (e.g., a boundary surface) between the first region D1 and the second region D2 which is in a bent state and, thus, may not be easily recognized by the user's eye E. Accordingly, even when one image is displayed on both the first region D1 and the second region D2 or different images are respectively displayed on the first region D1 and the second region D2, deterioration of the display quality that is caused by the third region D3 can be reduced or minimized. The first region D1, the second region D2, and the third region D3 may be defined as one display region D. Further, the display panel 100 may further include a non-display region N formed at an edge portion of the display region D and surrounding the display region D. For example, the non-display region N may be at an outer region of the first region D1 and the second region D2. In the non-display region N, a drive circuit for driving the first region D1 and the second region D2 may be mounted. The third region D3 may also include a drive portion that drives the first region D1 and the second region D2. Hereinafter, this will be described in more detail with reference to FIG. 6.

Figure 6:
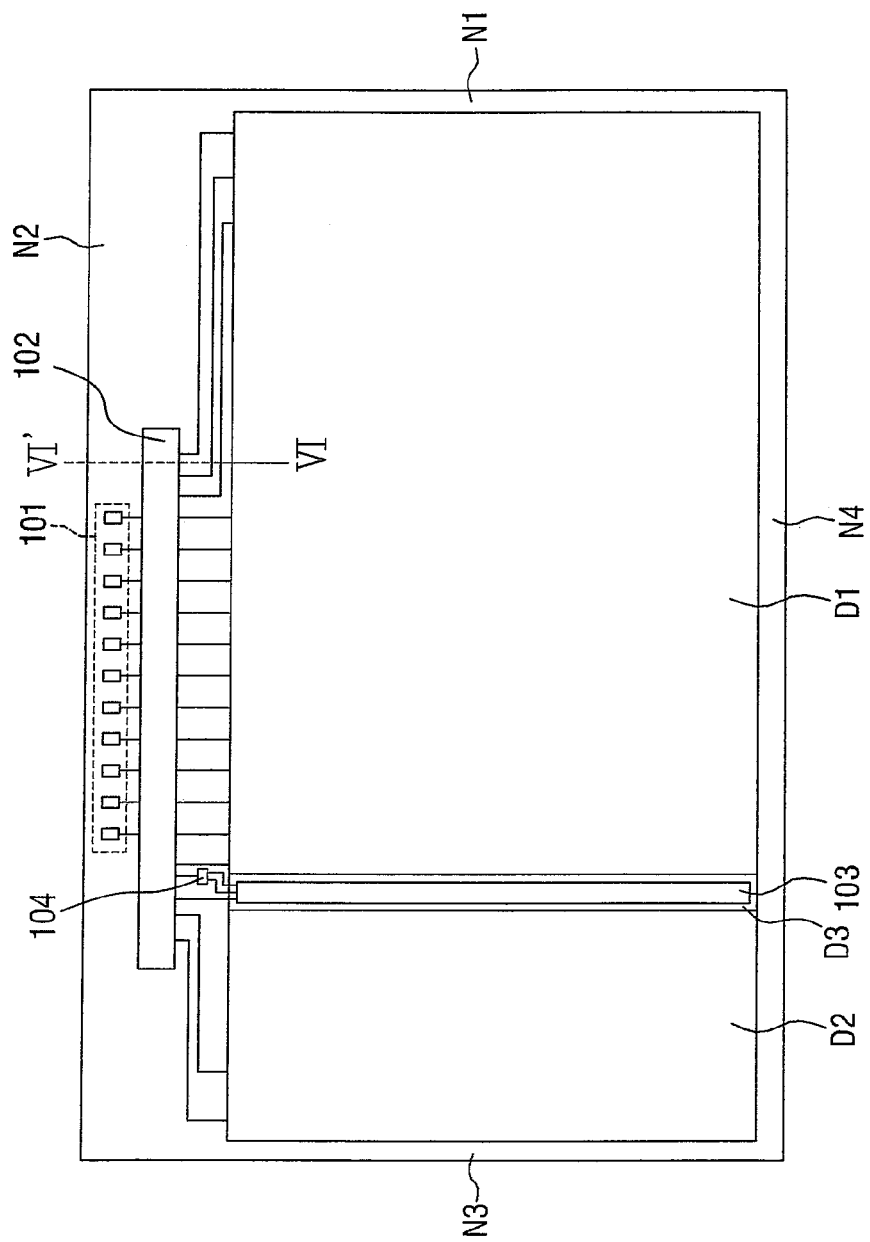
FIG. 6 is a block diagram of a display panel according to an embodiment of the present invention.

FIG. 6 is a block diagram of a display panel according to an embodiment of the present invention, and shows the respective components of the display panel 100 in a state before bending (e.g., in a flat state).

Referring to FIG. 6, the non-display region N may be formed at an outer portion of the display region D to surround the display region D. The non-display region N may be divided into first to fourth non-display regions N1 to N4 according to the direction in which the display region D is arranged. In the non-display region N, various kinds of circuits and wirings for supplying an image signal to display elements positioned in the display region D may be arranged, and the display elements of the display region D may display the provided image signal. For example, the display panel 100 may include a pad portion 101, a driver IC 102, and a scan drive portion 103.

In this embodiment, the pad portion 101 may be formed on the second non-display region N2. The pad portion 101 may be a region in which a flexible printed circuit board (FPCB) transmitting an external signal is coupled (e.g., connected). The pad portion 101 may transmit the external signal to the driver IC 102.

The driver IC 102 may be formed on the second non-display region N2. The formation positions of the driver IC 102 and the pad portion 101 in FIG. 6 are merely exemplary, and the present invention is not limited thereto. The driver IC 102 may generate a data voltage in response to the provided external signal and provide the data voltage to the first display portion of the first region D1 and the second display portion of the second region D2.

The scan drive portion 103 may provide the scan signal to the first region D1 and the second region D2 in response to the scan control signal. The display elements of the first region D1 and the second region D2 may be turned on by the scan signal to receive the data voltage that is provided from the driver IC 102. In this embodiment, the scan drive portion 103 is not formed on the non-display region N but may be formed on the third region D3 that corresponds to the bent region of the display region D. For example, in the display panel 100 according to an embodiment of the present invention, the scan drive portion 103 is formed on the third region D3 that is the bent region of the display region D, and thus, a relatively narrow non-display region N can be formed. By implementing the relatively narrow bezel, an extended display screen can be provided.

In some embodiments, the third region D3 of the display panel may include not only the scan drive portion 103 but also a power supply portion for supplying power to each pixel or a light emitting control portion when each pixel includes an organic light emitting element. Thus, the non-display region N becomes narrower, and the display panel can provide a narrower bezel.

In the display panel 100 according to an embodiment of the present invention, because the scan drive portion 103 is arranged between the first region D1 and the second region D2, the transmission distance of the scan signal is shortened, and thus, attenuation of the scan signal can be reduced or prevented.

Further, the first region D1 and the second region D2 may be respectively driven. For example, the scan drive portion 103 arranged on the third region D3 may provide the scan signal to the first region D1 and/or the second region D2. Hereinafter, the scan drive portion 103 will be described in more detail with reference to FIG. 7.

Figure 7:
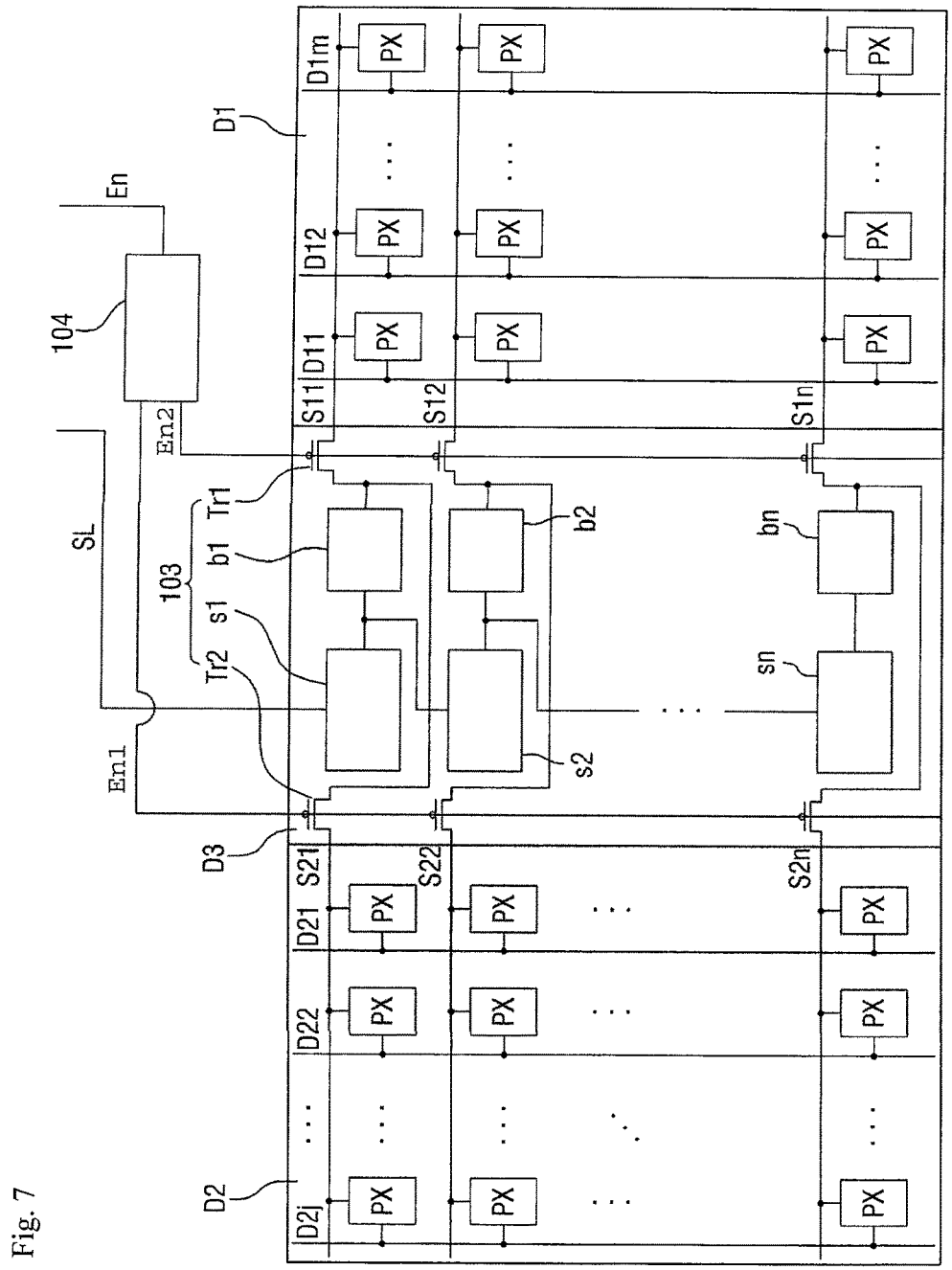
FIG. 7 is a block diagram of a scan drive portion and a display region according to an embodiment of the present invention.

FIG. 7 is a block diagram of a scan drive portion and a display region according to an embodiment of the present invention.

Referring to FIG. 7, the scan drive portion 103 may include a plurality of stages s1 to sn, a plurality of buffers b1 to bn coupled to terminals of the plurality of stages s1 to sn, and a first transistor Tr1 and a second transistor Tr2 coupled to terminals of the plurality of buffers b1 to bn. Further, the display panel 100 may further include a scan signal controller 104 (e.g., a scan signal control portion) controlling the scan signal.

The respective stages s1 to sn may correspond to the respective scan lines of the first region D1 and the second region D2 to provide the scan signals to the corresponding scan lines. The scan signals may be output through the buffers b1 to bn coupled to the respective stages s1 to sn. In this embodiment, the scan signals may be successively generated through the first to n-th stages s1 to sn and may be successively provided to the respective scan lines. For example, the first stage s1 may provide the first scan signal to the first buffer b1 and the second stage s2 in response to the scan control signal SL. The second stage s2 may generate a second scan signal in response to the first scan signal and may provide the generated second scan signal to the second buffer b2 and the third stage s3. In this manner, the respective stages s1 to sn may provide the generated scan signals to the next stages, and the next stages may form the scan signals in response to the provided scan signals. Further, a gate-on voltage and a gate-off voltage may be provided to the respective stages s1 to sn, and the scan signal of the next stage may be fed back to the previous stage to control the scan signal output of the previous stage.

The plurality of buffers b1 to bn may amplify the scan signals provided from the plurality of stages s1 to sn coupled thereto and may output the amplified scan signals to a first node. The scan signals provided to the first node may be transmitted to the first transistor Tr1 and the second transistor Tr2.

The first transistor Tr1 and the second transistor Tr2 may be respectively turned on in response to a first scan selection signal En1 and a second scan selection signal En2 and, thus, may transmit the transmitted scan signals to the scan lines coupled thereto. The first region D1 and the second region D2 may include a plurality of display elements PX that are arranged in the form of a matrix. The display elements PX may be pixels of various display devices, such as an organic light emitting device, a liquid crystal display, and an electrophoretic display. In this embodiment, the display elements PX are described as organic light emitting elements, but the display elements are not limited thereto.

The plurality of display elements PX in the first region D1 may be turned on in response to the first to n-th scan signals S11 to S1n and, thus, may receive data voltages D11 to D1m that are provided from the driver IC 102. The plurality of display elements PX in the second region D2 may be turned on in response to the first to n-th scan signals S21 to S2n and, thus, may receive data voltages D21 to D2j that are provided from the driver IC 102.

The scan signal control portion 104 may receive the scan selection signal En from the scan drive terminal portion 101a and may generate the first scan selection signal En1 and the second scan selection signal En2 in response to the scan selection signal En. For example, the scan signal control portion 104 may provide at least one of the first scan selection signal En1 and the second scan selection signal En2 to the scan drive portion 103. The scan signal control portion 104 may be formed on the second non-display region N2 as illustrated in FIG. 7 but is not limited thereto. The scan signal control portion 104 may be formed on the third region D3 of the display region D.

When only the first region D1 is to display an image, the scan signal control portion 104 may output the first scan selection signal En1 only in response to the scan selection signal En to turn on the first transistor Tr1 only. Further, when only the second region D2 is to display an image, the scan signal control portion 104 may output the second scan selection signal En2 only in response to the scan selection signal En to turn on the second transistor Tr2 only. Further, when both the first region D1 and the second region D2 are to display images, the scan signal control portion 104 may output both the first scan selection signal En1 and the second scan selection signal En2 to turn on both the first transistor Tr1 and the second transistor Tr2.

As described above, the scan drive portion 103 of the display panel 100 according to this embodiment can selectively provide the scan signals to the first region D1 and/or the second region D2 and, thus, power consumption can be reduced.

Hereinafter, the internal structure of the display panel 100 according to this embodiment will be described in more detail.

Figure 8:
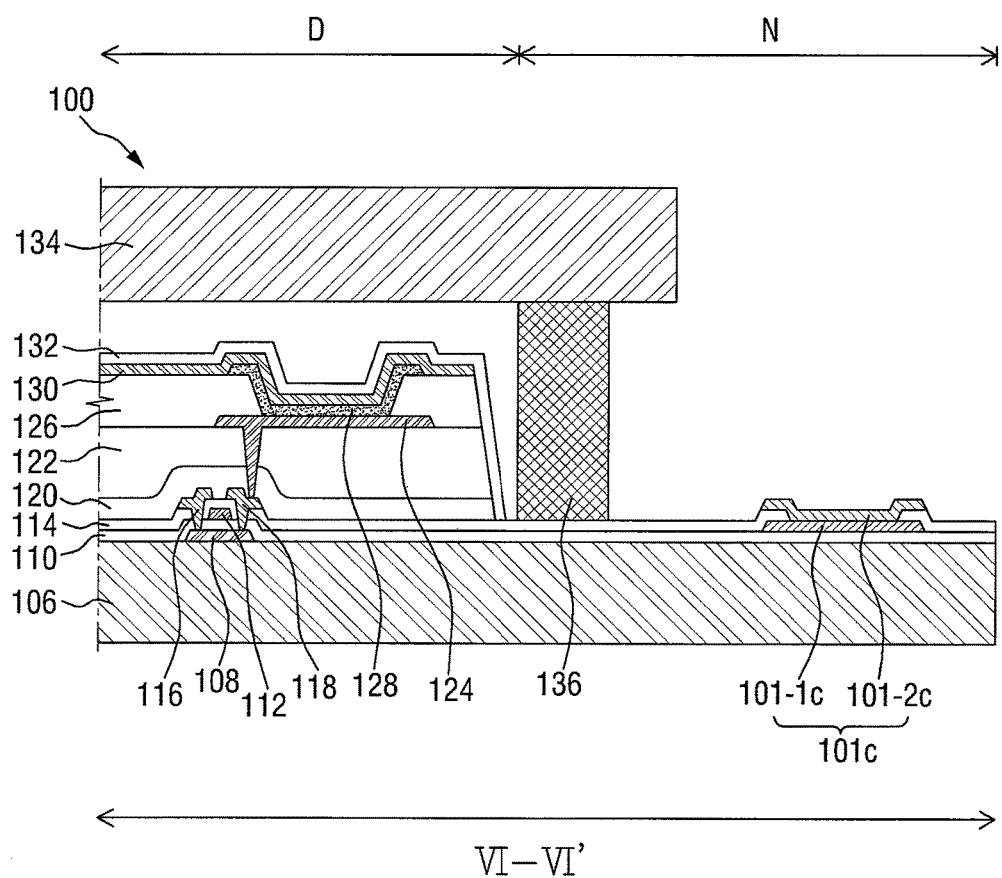
FIG. 8 is a cross-sectional view of a display panel taken along the line VI-VI' of FIG. 6.

FIG. 8 is a cross-sectional view of a display panel taken along the line VI-VI' of FIG. 6. FIG. 8 is a cross-sectional view schematically illustrating the first region D1 and a portion of the second non-display region N2. The structure of the first region D1 to be further described below may also be applied to the second region D2.

The display panel 100 is a panel on which an image is displayed. The display panel 100 may include a terminal portion 101c, a first substrate 106, a semiconductor pattern 108, a gate insulating layer 110, a gate electrode 112, an interlayer insulating layer 114, a source electrode 116, a drain electrode 118, an intermediate layer 120, a planarization layer 122, a first electrode 124, a pixel defining layer 126, an organic light emitting layer 128, a second electrode 130, a protection layer 132, a second substrate 134, and a sealant 136. The terminal portion 101c may include a pad terminal 110-1c and an auxiliary terminal 110-2c.

The first substrate 106 may include a polymer having high heat resistance. For example, the first substrate 106 may include polyethersulfone (PES), polyarylate (PAR), polyetherimide (PEI), polyethylene naphthalate (PEN), polyethylene terephthalate (PEN), polyphenylene sulfide (PPS), polyacrylate, polyimide (PI), polycarbonate (PC), cellulose triacetate, cellulose acetate propionate (CAP), poly (arylene ether sulfone), and/or a combination thereof. The first substrate 106 may be flexible. That is, the first substrate 106 may be a substrate which can change shape, such as by rolling, folding, and/or bending.

The first substrate 106 may include a display region D and a non-display region N.

The display region D may be a region on which an image is displayed. Further, the display region D may be a region on which display elements for displaying an image and thin film transistors electrically coupled to (e.g., electrically connected to) the display elements are positioned. The display elements may be organic light emitting elements but are not limited thereto. The non-display region N may be a region on which no image is displayed. Further, the non-display region N may be a region on which the sealant 136 and the terminal portion 101c are positioned. Further, the non-display region N may be a region that is adjacent to an edge of the first substrate 106. For example, the non-display region N may be a region that is positioned at an edge portion of the first substrate 106.

The non-display region N may surround the display region D. In an exemplary embodiment, the non-display region N may have a circular donut shape that surrounds the entire display region D.

A buffer layer may be positioned on the first substrate 106. The buffer layer may prevent metal atoms and impurities from being diffused through the first substrate 106. Further, when the surface of the first substrate 106 is not uniform, the buffer layer may serve to improve the flatness of the surface of the first substrate 106.

The semiconductor pattern 108 may be formed on the first substrate 106. For example, the semiconductor pattern 108 may be positioned on the display region D of the first substrate 106. When a buffer layer is formed on the first substrate 106, the semiconductor pattern 108 may be formed on the buffer layer. The semiconductor pattern 108 may be made of amorphous semiconductor, microcrystalline semiconductor, or polycrystalline semiconductor. In one embodiment, the semiconductor pattern 108 is made of polycrystalline semiconductor. Further, the semiconductor pattern 108 may also be made of oxide semiconductor. Further, the semiconductor pattern 108 may include a channel portion that is not doped with an impurity and a source portion and a drain portion that are each doped with p+ on respective sides of the channel portion. In this embodiment, a doped ion material may be a P-type impurity, such as boron (B), and, for example, $B_2H_6$. The impurity may differ depending on the kind of thin film transistor.

The gate insulating layer 110 may be formed to cover the semiconductor pattern 108 on the buffer layer. The gate insulating layer 110 may be positioned on the display region D and the non-display region N of the first substrate 106. The gate insulating layer 110 may be made of silicon oxide ($SiO_x$), silicon nitride ($SiN_x$), or metal oxide.

The gate electrode 112 may be formed on the gate insulating layer 110. The gate electrode 112 may be positioned on the display region D of the first substrate 106. The gate electrode 112 may be formed on a portion of the gate insulating layer 110 below which the semiconductor pattern 108 is positioned. The gate electrode 112 may include metal, an alloy, metal nitride, conductive metal oxide, or a transparent conductive material. Further, the gate electrode 112 and the channel portion may overlap each other. However, the dimensions of the gate electrode 112 and/or the dimensions of the channel portion may be varied depending on the electrical characteristics of the switching element including the same.

The pad terminal 101-1c may also be formed on the gate insulating layer 110. The pad terminal 101-1c may be positioned on the non-display region N of the first substrate 106. The pad terminal 101-1c may include metal, an alloy, metal nitride, conductive metal oxide, or a transparent conductive material. Further, the pad terminal 101-1c may be made of the same material as that of the gate electrode 112. Further, the pad terminal 101-1c may be formed concurrently (e.g., simultaneously) with the gate electrode 112.

The interlayer insulating layer 114 may be formed on the gate insulating layer 110 to cover the gate electrode 112 and the pad terminal 101-1c. The interlayer insulating layer 114 may be formed on the display region D and on the non-display region N of the first substrate 106. The interlayer insulating layer 114 may be formed on the gate insulating layer 110 along profiles of the gate electrode 112 and the pad terminal 101-1c to have a substantially uniform thickness. Accordingly, a step height portion that is adjacent to the gate electrode 112 and the pad terminal 101-1c may be formed in (e.g., under) the interlayer insulating layer 114. The interlayer insulating layer 114 may be made of silicon compound. The interlayer insulating layer 114 may serve to insulate the gate electrode 112 from a source electrode 116 and a drain electrode 118 to be subsequently formed.

The interlayer insulating layer 114 may include a first contact opening (e.g., a first contact hole) for exposing a part of the semiconductor pattern 108 and a second contact opening (e.g., a second contact hole) for exposing a part of the pad terminal 101-1c. The first contact opening may be formed on the display region D of the first substrate 106. In an exemplary embodiment, the first contact opening may expose a source portion and a drain portion of the semiconductor pattern 108. In the exemplary embodiment illustrated in FIG. 8, when the gate insulating layer 110 is positioned on the semiconductor pattern 108, the first contact opening may be formed to penetrate the gate insulating layer 110. The first contact opening may be formed to extend in a direction that is perpendicular to a surface of the first substrate 106. The second contact opening may be formed on the non-display region N of the first substrate 106. In an exemplary embodiment, the second contact opening may expose a center portion of the pad terminal 101-1c. The second contact opening may be formed to extend in the direction that is perpendicular to the surface of the first substrate 106.

The source electrode 116 and the drain electrode 118 may be formed on the interlayer insulating layer 114. For example, the source electrode 116 and the drain electrode 118 may be inserted into the first contact opening. For example, the source electrode 116 and the drain electrode 118 may be formed on the display region D of the first substrate 106. The source electrode 116 and the drain electrode 118 may be arranged to be spaced from (e.g., spaced apart from) each other by a distance (e.g., a predetermined distance) around the gate electrode 112 and to be adjacent to the gate electrode 112. For example, the source electrode 116 and the drain electrode 118 may penetrate the interlayer insulating layer 114 and the gate insulating layer 110 and may come in contact with the source portion and the drain portion of the semiconductor pattern 108. The source electrode 116 and the drain electrode 118 may include metal, an alloy, metal nitride, conductive metal oxide, or a transparent conductive material.

As the source electrode 116 and the drain electrode 118 are formed on the interlayer insulating layer 114, a thin film transistor, which includes the semiconductor pattern 108, the gate insulating layer 110, the gate electrode 116, and the drain electrode 118, may be provided on the first substrate 106 as a switching element of the organic light emitting display device. The thin film transistor may be a top-gate thin film transistor.

The auxiliary terminal 101-2c may also be formed on the interlayer insulating layer 114. For example, the auxiliary terminal 101-2c may be inserted into the second contact opening. That is, the auxiliary terminal 101-2c may be formed on the non-display region N of the first substrate 106. One pad terminal 101-1c and one auxiliary terminal 101-2c may constitute one terminal portion 101c. The driver IC 102 may be mounted on the terminal portion 101c.

The intermediate layer 120 may be formed on the source electrode 116 and the drain electrode 118. For example, the intermediate layer 120 may be formed on the interlayer insulating layer 114 to cover the source electrode 116 and the drain electrode 118. The intermediate layer 120 may be formed on the display region D of the first substrate 106. The intermediate layer 120 may have a thickness that is sufficient to completely cover the source electrode 116 and the drain electrode 118. The intermediate layer 120 may be include an organic material or an inorganic material.

The planarization layer 122 may be formed on the intermediate layer 120. The planarization layer 122 may be formed on the display region D of the first substrate 106. The surface of the planarization layer 122 may be flat. For example, the planarization layer 122 may be formed having a sufficient thickness to planarize one surface on which a pixel is positioned. The planarization layer 122 may be made of an insulating material.

The planarization layer 122 may include a via-hole (e.g., a via-opening) that exposes a portion of the drain electrode 118. In an exemplary embodiment, the via-hole may expose the center portion of the drain electrode 118. The via-hole may be formed to extend in the direction that is perpendicular to the surface of the substrate 106.

The first electrode 124 may be positioned on the planarization layer 122. The first electrode 124 may be formed on the display region D of the first substrate 106. The first electrode 124 may be in the via-hole and may be electrically coupled to the drain electrode 118. The first electrode 124 may be an anode electrode or a cathode electrode. When the first electrode 124 is an anode electrode, the second electrode 130 is a cathode electrode. Hereinafter, under the assumption as described above, exemplary embodiments will be described. However, the first electrode 124 maybe a cathode electrode, and the second electrode 130 may be an anode electrode.

When the first electrode 124 is the anode electrode, the first electrode 124 may be made of a conductive material having a high work function. When the display device is a bottom emission type display device, the first electrode 124 may be formed of a material, such as ITO, IZO, ZnO, or $In_2O_3$ or a laminate thereof. When the display device is a top emission type display device, the first electrode 124 may further include a reflection layer that is formed of, for example, Ag, Mg, Al, Pt, Pd, Au, Ni, Nd, Ir, Cr, Li, or Ca. The first electrode 124 may be variously modified, such as by being at least a two-layer structure using at least two different materials as described above.

The pixel defining layer 126 may be formed on the first electrode 124. The pixel defining layer 126 may be formed on the display region D of the first substrate 106. The pixel defining layer 126 may expose some regions (e.g., portions) of the first electrode 124. The pixel defining layer 126 may include at least one organic material, such as benzocyclobutene (BCB), polyimide (PI), polyamide (PA), acryl resin, and/or phenol resin, or may include an inorganic material, such as silicon nitride. The pixel defining layer 126 may also be made of a photoconductor including a black pigment, and in this embodiment, the pixel defining layer 126 may act as a light shield member.

The organic light emitting layer 128 may be formed on the first electrode 124. The organic light emitting layer 128 may be formed on the display region D of the first substrate 106. When current is applied to the organic light emitting layer 128, electrons and holes are recombined in the organic light emitting layer 128 to form excitations and light having a specific wavelength is generated by energy from the formed excitations.

The organic light emitting layer 128 may be made of a low molecular weight organic material or a high molecular weight organic material. The organic light emitting layer 128 may include a hole-injection layer (HIL), a hole-transporting layer (HTL), a hole blocking layer (HBL), a light emitting layer (EML), an electron-transporting layer (ETL), an electron-injection layer (EIL), and/or an electron blocking layer (EBL).

The second electrode 130 may be formed on the organic light emitting layer 128. The second electrode 130 may be formed on the display region D of the first substrate 106. When the second electrode 130 is the cathode electrode, the second electrode 130 may be made of a conductive material having a low work function. In an exemplary embodiment, the second electrode 130 may be formed of Ag, Mg, Al, Pt, Pd, Au, Ni, Nd, Ir, Cr, Li, or Ca.

As the second electrode 130 is formed on the organic light emitting layer 128, an organic light emitting element, which includes the first electrode 124, the organic light emitting layer 128, and the second electrode 130, may be provided on the first substrate 106 as a display element of the display device.

The protection layer 132 may be formed on the second electrode 130. The protection layer 132 may be formed on the display region D of the first substrate 106. The protection layer 132 may prevent or reduce deterioration of the display element by protecting the display element from external moisture or oxygen.

The protection layer 132 may be an organic layer, an inorganic layer, or have a multilayer structure including these layers. The protection layer 132 may be formed using an evaporation method, a CVD method, or a sputtering method.

The second substrate 134 may be positioned on the protection layer 132. The second substrate 134 may be spaced from (e.g., spaced apart from) the protection layer 132 by a distance (e.g., by a predetermined distance). Nitrogen may fill between the second substrate 134 and the protection layer 132. The second substrate 134 may face the first substrate 106. The second substrate 134 may be positioned to cover the whole display region D and a part (e.g., a portion) of the non-display region N of the first substrate 106. The second substrate 134 may encapsulate the display elements and thin film transistors together with the sealant 136.

The second substrate 134 may be made of transparent plastic but is not limited thereto. The second substrate 134 may be made of various materials that can intercept external materials (e.g., prevent external materials from passing therethrough). In an exemplary embodiment, the second substrate 134 may be made of the same material as that of the first substrate 106.

The sealant 136 may be positioned at edge portions of the first substrate 106 and the second substrate 134. In an exemplary embodiment, the sealant 136 may be positioned on the non-display region N of the first substrate 106. The sealant 136 may come in contact with the interlayer insulating layer 114 that is positioned on the first substrate 106 but is not limited thereto. The sealant 136 may come in contact with the gate insulating layer 110 or the first substrate 106. In the exemplary embodiment illustrated in FIG. 8, the sealant 136 may come in contact with the interlayer insulating layer 114 and the second substrate 134 to encapsulate the display elements and thin film transistors.

Hereinafter, a display panel according to another embodiment of the present invention will be described.

Figure 9:
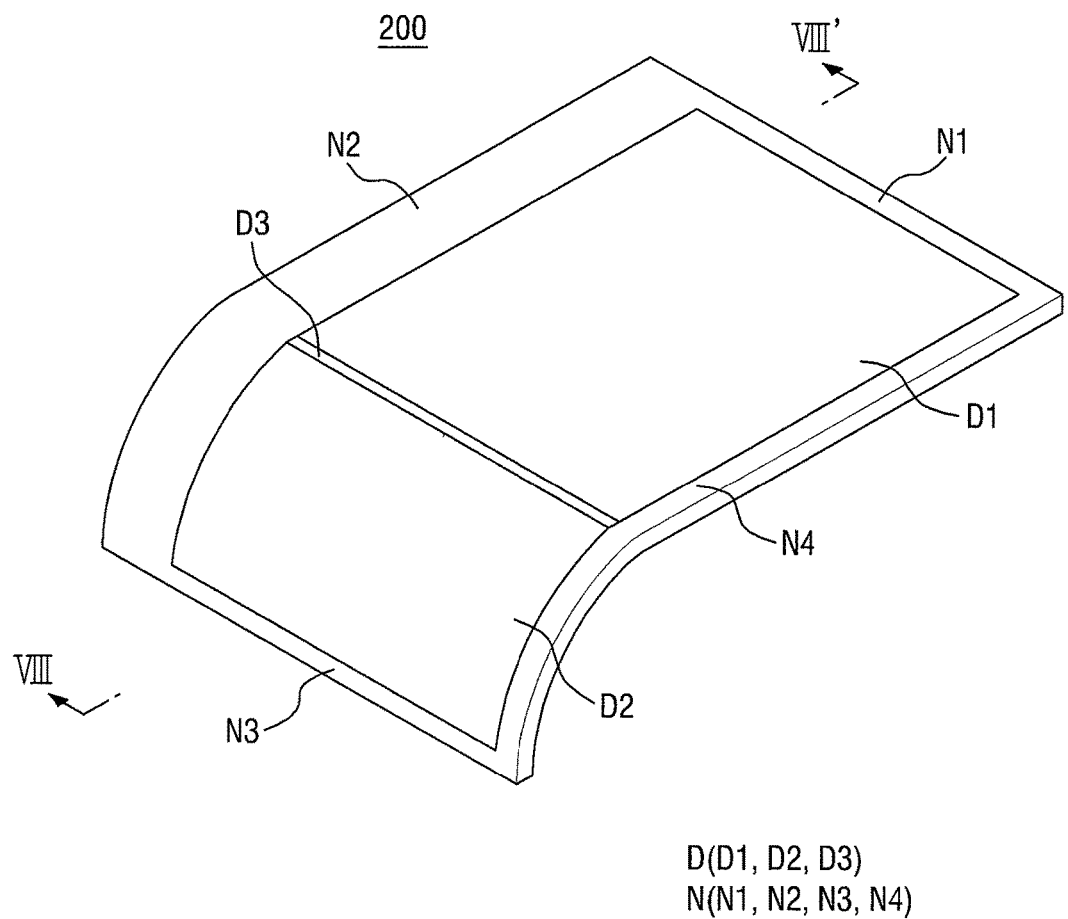
FIG. 9 is a perspective view schematically illustrating a display panel according to another embodiment of the present invention.
Figure 10:
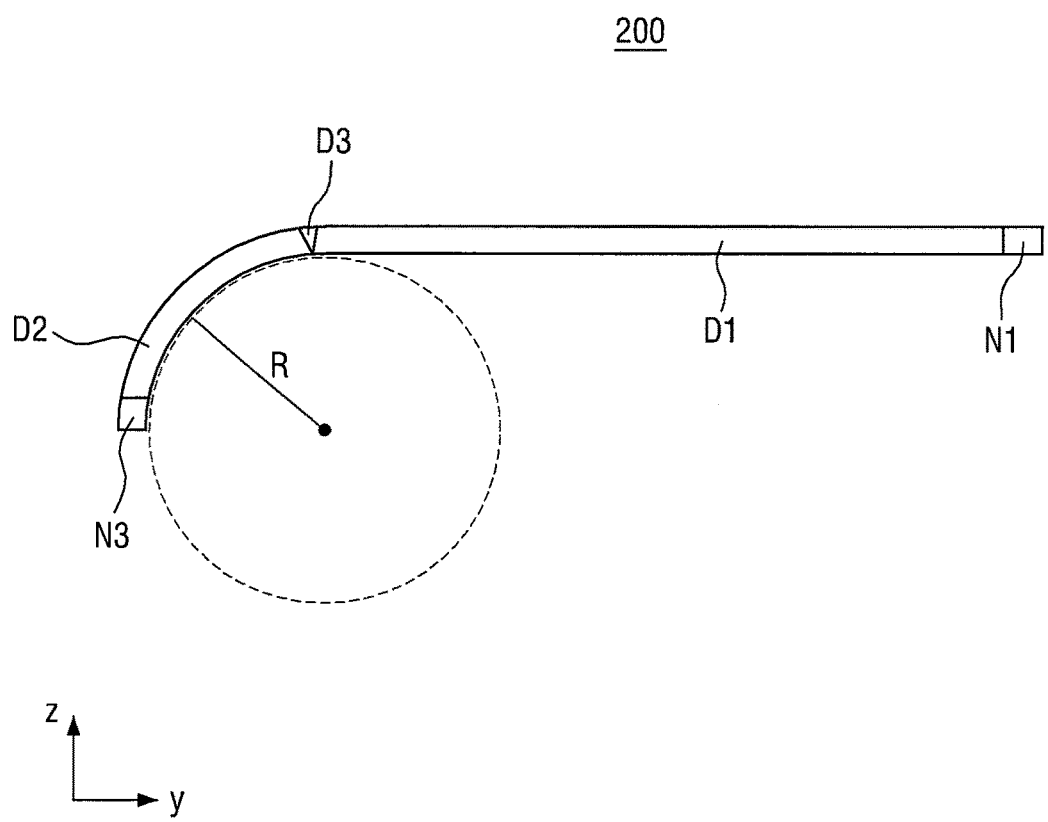
FIG. 10 is a cross-sectional view of the display panel taken along the line VIII-VIII' of FIG. 9.

FIG. 9 is a perspective view schematically illustrating a display panel according to another embodiment of the present invention, and FIG. 10 is a cross-sectional view of a display panel taken along the line VIII-VIII' of FIG. 9.

Referring to FIGS. 9 and 10, a display panel 200 includes a display region D and a non-display region N. The display region D may include a first region D1, a second region D2, and a third region D3. The first region D1 and the second region D2 may be regions on which an image is displayed. The second region D2 may be positioned to extend from one end of the first region D1 to continue the first region D1. The first region D1 may be a main display screen of the display region D, and the second region D2 may be an auxiliary display screen of the display region D, but the regions are not limited thereto. The third region D3 may be formed between the first region D1 and the second region D2. The third region D3 may extend in a first direction X to couple one end of the first region D1 to an end of the second region D2. For example, the second region D2 may be positioned to continue the first region D1 through the third region D3. The third region D3 may be a bent region, and the first region D1 and the second region D2 of the display region D may be bent along the third region D3.

The first region D1 of the display panel 200 may have a substantially planar shape, and the second region D2 may have a curved surface shape that is bent along a curvature (e.g., a preset curvature). As illustrated in FIG. 10, the second region D2 may be bent in a counterclockwise direction R1 so as to have a radius of curvature R. The second region D2 may be a part of a circumference of a circle having a constant radius of curvature R. In one embodiment, a length of the second region D2 may be about ¼ of the circumference of the circle or less but is not limited thereto. As the second region D2 is formed as a curved surface, the display panel 200 including the same can provide an improved sense of grip and sense of beauty.

Because other configurations of the display panel 200 are substantially the same or the same as that of the display panel 100 shown in FIGS. 1 to 8, the description of features having the same reference numerals or the same names may be omitted.

Hereinafter, a display panel according to still another embodiment of the present invention will be described.

Figure 11:
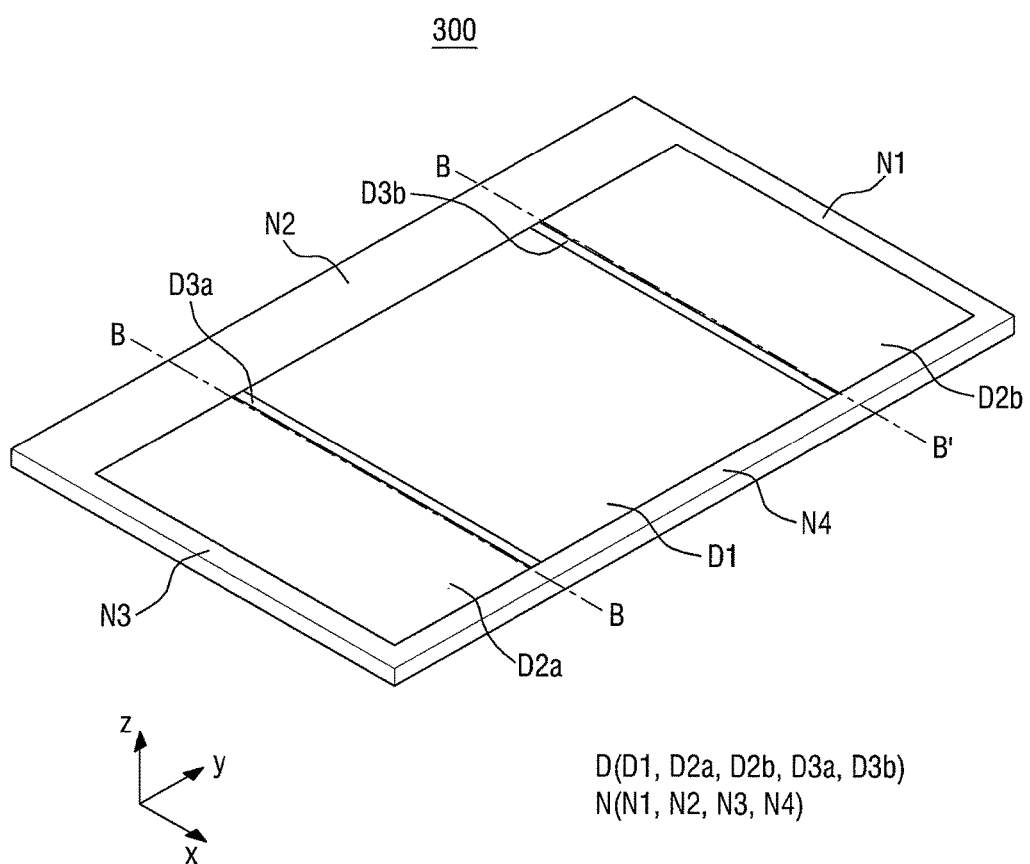
FIG. 11 is a perspective view schematically illustrating a display panel according to still another embodiment of the present invention.
Figure 12:
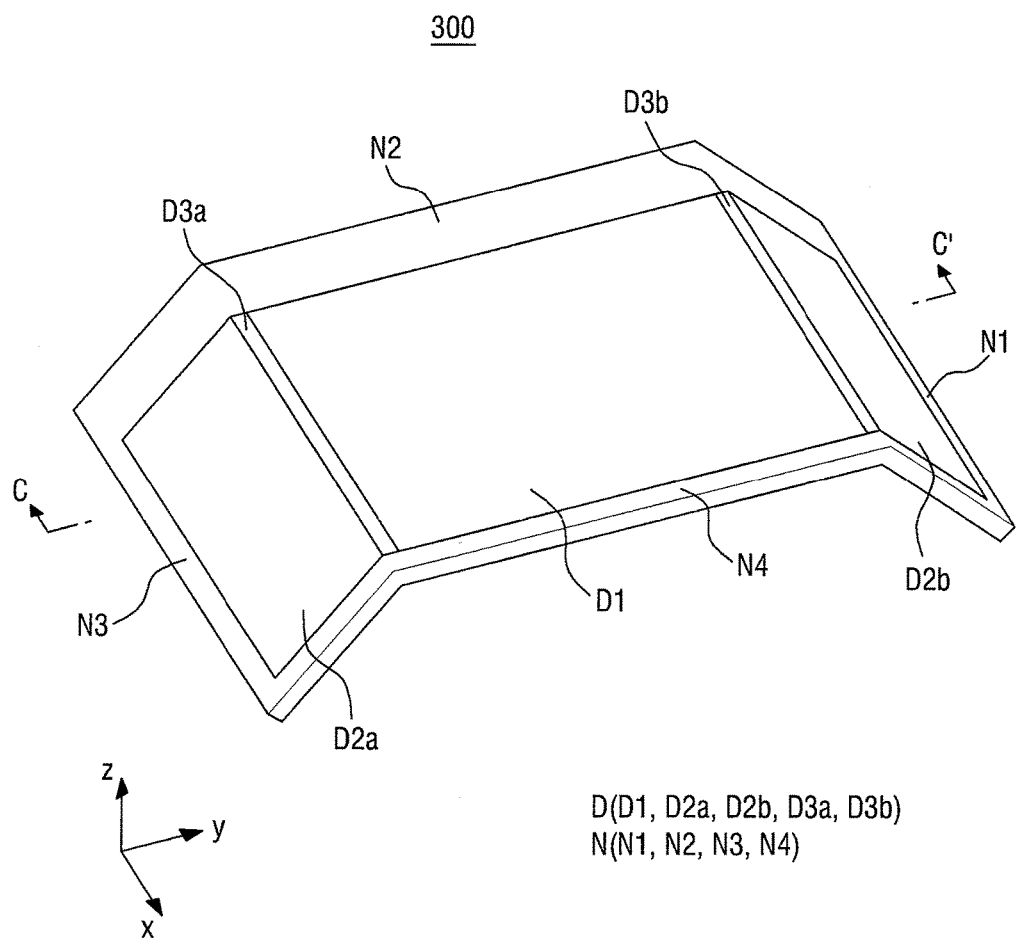
FIG. 12 is a perspective view illustrating the display panel that is bent along the line B-B' of FIG. 11.
Figure 13:
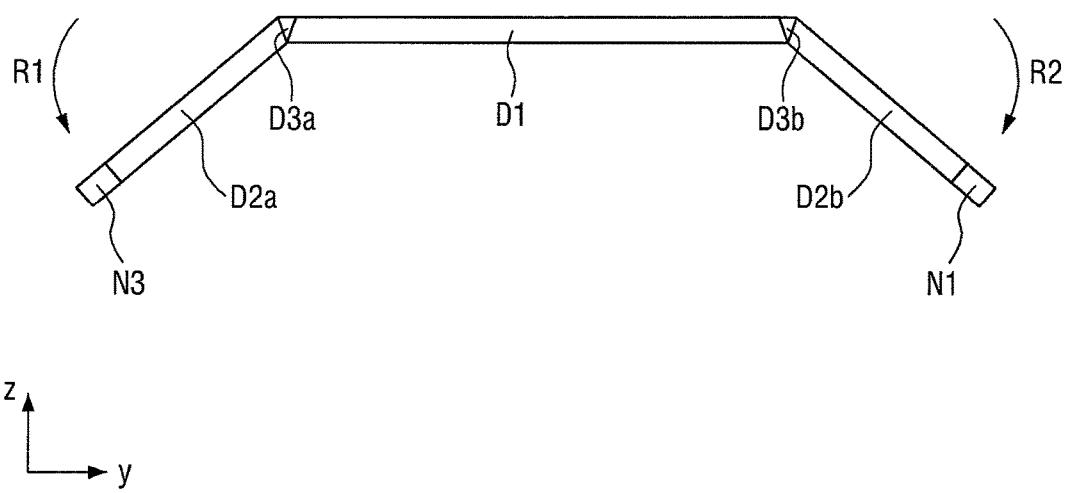
FIG. 13 is a cross-sectional view of the display panel taken along the line C-C' of FIG. 10.
Figure 14:
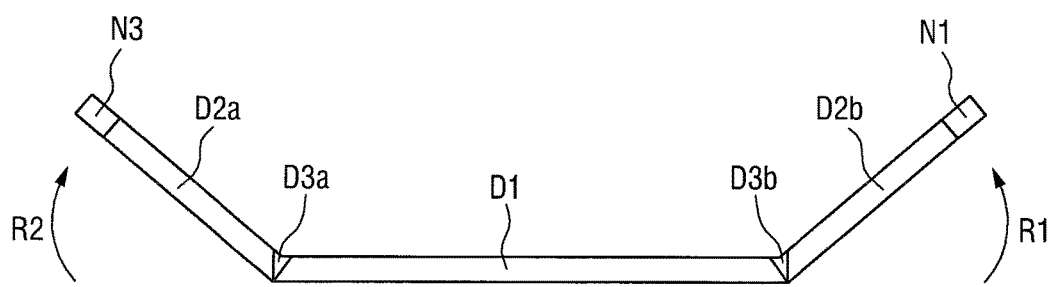
FIG. 14 is a cross-sectional view of the display panel that is bent in the opposite direction the display panel of FIG. 13 is bent.
Figure 14:
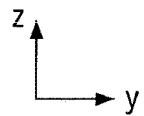

FIG. 11 is a perspective view schematically illustrating a display panel according to still another embodiment of the present invention. FIG. 12 is a perspective view illustrating a display panel that is bent along the line B-B' of FIG. 11, and FIG. 13 is a cross-sectional view of a display panel taken along the line C-C' of FIG. 12. FIG. 14 is a cross-sectional view of a display panel that is bent in the opposite direction of the direction in FIG. 13.

Referring to FIGS. 11 to 14, a display panel 300 includes a display region D and a non-display region N. The display region D may include a first region D1, second regions D2a and D2b, and third regions D1a and D3b. The first region D1 and the second regions D2a and D2b may be regions on which an image is displayed. The first region D1 may be a main display screen of the display region D, and the second regions D2a and D2b may be auxiliary display screens of the display region D but are not limited thereto.

The third regions D3a and D3b may be formed on both sides of the first region D1. For example, the third regions D3a and D3b may be formed between the first region D1 and the second regions D2a and D2b, respectively. The third region D3a may extend in a first direction X to couple one end of the first region D1 to an end of the second region D2b arranged on one side thereof, and the third region D3b may extend in the first direction X to couple the other end of the first region D1 to an end of the second region D2b arranged on the other side thereof. The second region D2a arranged on one side of the first region D1 may be positioned to continue the first region D1 through the third region D3a, and the second region D2b arranged on the other side of the first region D1 may be positioned to continue the first region D1 through the third region D3b. For example, the display region D may be arranged in the order of the second region D2a, the third region D3a, the first region D1, the third region D3b, and the second region D2b along a second direction Y that crosses (e.g., is perpendicular to) the first direction X.

The third regions D3a and D3b may be bent regions. The first region D1 and the second regions D2a and D2b of the display region D may be bent along the third region D3a and D3b. As illustrated in FIGS. 12 and 13, the second regions D2a and D2b may be bent along the bending lines B-B'. The second region D2a that is arranged on one side of the first region D1 may be bent in a counterclockwise direction R1 along the bending line formed on one side of the third region D3a, and the second region D2b that is arranged on the other side of the first region D1 may be bent in a clockwise direction R2 along the bending line formed on the other side of the third region D3b. For example, the second regions D2a and D2b may be bent to face each other along the third regions D3a and D3b. However, without being limited thereto, as shown in FIG. 14, the second regions D2a and D2b may be bent in an upward direction with respect to the first region D1.

The display panel 300 according to this embodiment may be a display panel in which the left and right sides of the display region D are bent to provide an extended display screen. In this embodiment, the second regions D2a and D2b are formed on the left and right sides of the first region D1, respectively, but are not limited thereto. The second regions D2a and D2b may be formed on upper and lower sides of the first region D1 or at other positions.

The display panel 300 may be in a fixed state after being bent, but it is not limited thereto. For example, the third region D3 may include a flexible material and may be transformed into a state opposite to the currently folded state or a flat state. Further, the entire substrate of the display panel 300 may be formed of a flexible material. For example, all of the first region D1, the second regions D2a and D2b, and the third regions D3a and D3b may be flexible.

In this embodiment, the third region D3 may be a region that is bent more frequently than the first region D1 and the second region D2 and may be formed of a more flexible material than that of the first region D1 and the second regions D2a and D2b.

The third regions D3a and D3b correspond to bent portions of the flexible display panel and may be invisible regions that are not recognized by a user's eye. For example, the third regions D3a and D3b may correspond to boundary surfaces (e.g., interfaces) between the first region D1 and the second regions D2a and D2b, respectively, which are in a bent state and, thus, may not be easily recognized by the user's eye. Accordingly, even if one image is displayed on both the first region D1 and the second regions D2a and D2b or different images are respectively displayed on the first region D1 and the second regions D2a and D2b, deterioration of the display quality that is caused by the third regions D3a and D3b can be reduce or minimized. The third regions D3a and D3b may include a drive portion that drives the first region D1 and the second regions D2a and D2b, respectively. Hereinafter, this will be described in more detail with reference to FIGS. 12 and 13.

Figure 15:
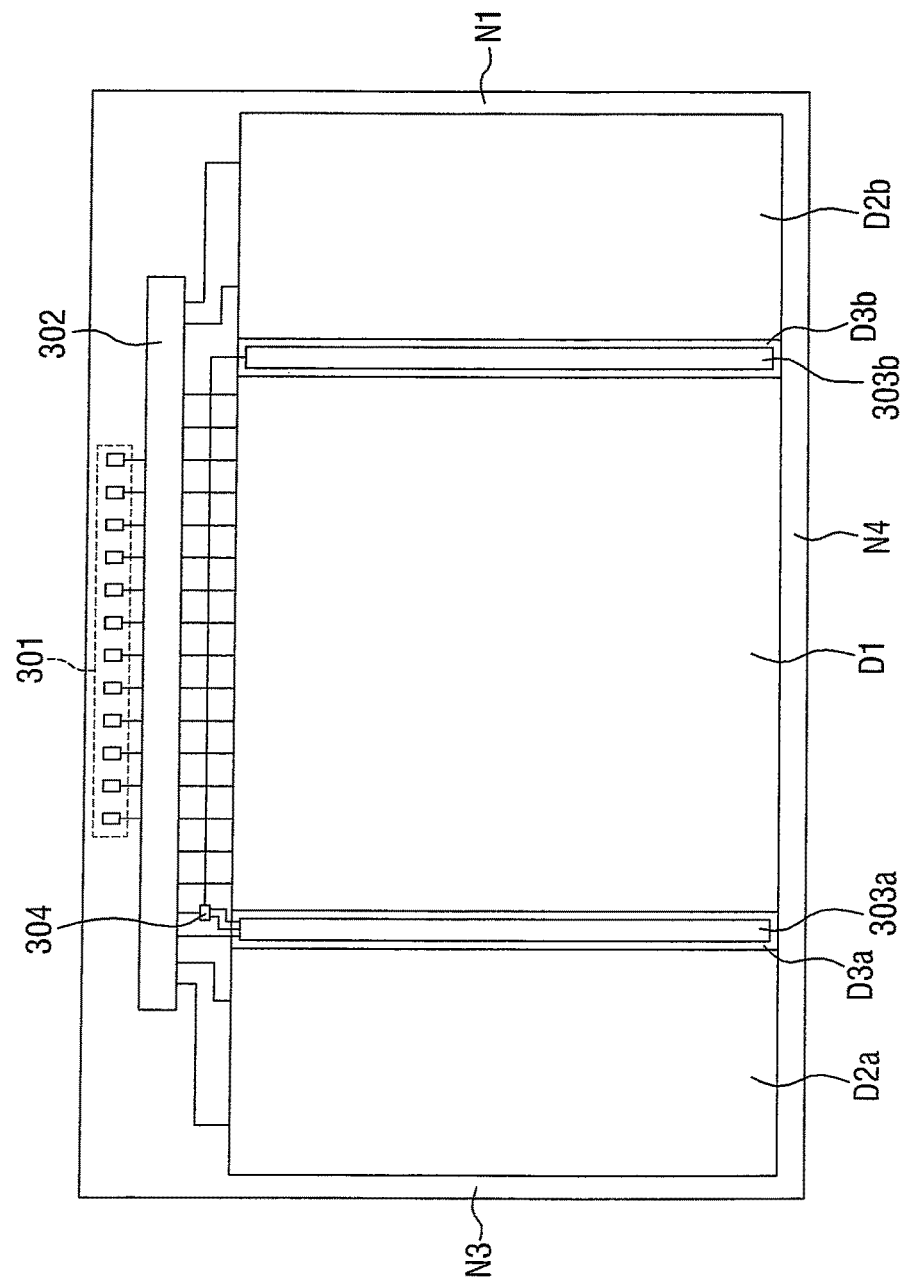
FIG. 15 is a block diagram of a display panel according to still another embodiment of the present invention.
Figure 16:
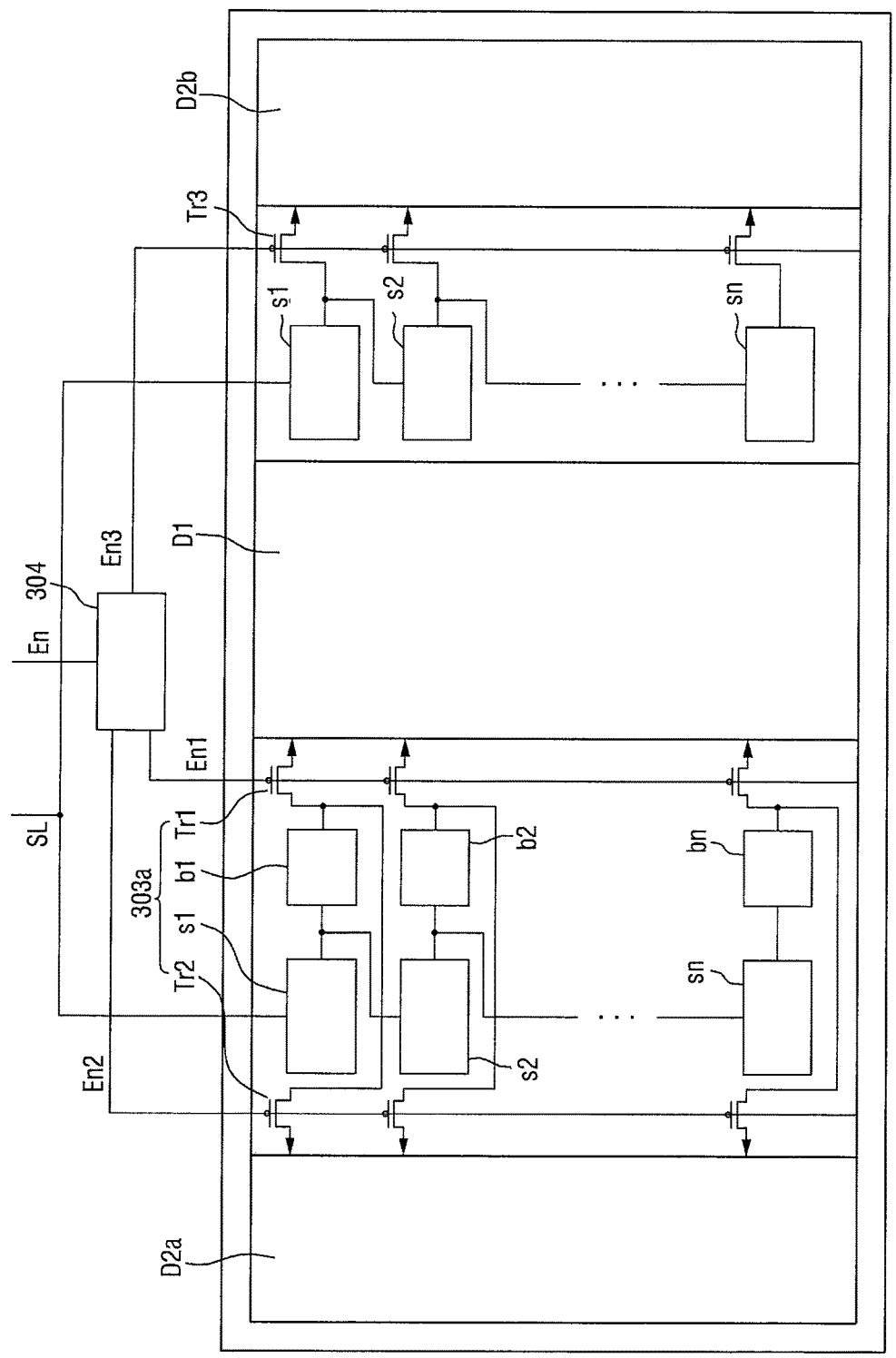
FIG. 16 is a block diagram of a scan drive portion and a display region according to still another embodiment of the present invention.

FIG. 15 is a block diagram of a display panel according to still another embodiment of the present invention, and FIG. 16 is a block diagram of a scan drive portion and a display region according to still another embodiment of the present invention.

Referring to FIGS. 15 and 16, the third region D3a may include a first scan drive portion 303a, and the third region D3b may include a second scan drive portion 303b. The first scan drive portion 303a may provide the scan signal to the second region D2a arranged on one side of the first region D1 and to the first region D1, and the second scan drive portion 303b may provide the scan signal to the second region D2b arranged on the other side of the first region D1.

The scan drive portion 303a may include a plurality of stages s1 to sn successively generating the scan signals, a plurality of buffers b1 to bn coupled to terminals of the plurality of stages s1 to sn to amplify the generated scan signals, and a first transistor Tr1 and a second transistor Tr2 coupled to terminals of the plurality of buffers b1 to bn. The scan drive portion 303b may include a plurality of stages s1 to sn successively generating the scan signals and a third transistor Tr3 coupled to the terminals of the plurality of stages s1 to sn. Because the second scan drive portion 303b provides the scan signal only to the second region D2a arranged on the other side, the buffers can be omitted.

The first to third transistors Tr1 to Tr3 may be respectively turned on in response to first to third scan selection signals En1 to En3 and, thus, may transmit the transmitted scan signals to the scan lines coupled thereto. For example, the first scan drive portion 303a and the second scan drive portion 303b may selectively provide the scan signals to the first region D1 and the second region D2 according to the first to third scan selection signals En1 to En3.

The first to third scan selection signals En1 to En3 may be generated by a scan signal control portion 340. The scan signal control portion 340 may generate the first to third scan selection signals En1 to En3 in response to the scan selection signal En and may provide at least one of the first to third scan selection signals En1 to En3 to the first region D1 or the second region D2.

Because other configurations of the display panel 300 are substantially the same or the same as those of the display panel 100 shown in FIGS. 1 to 8, the description of features that have the same reference numerals or the same names may be omitted.

Hereinafter, a display panel 400 according to still another embodiment of the present invention will be described.

Figure 17:
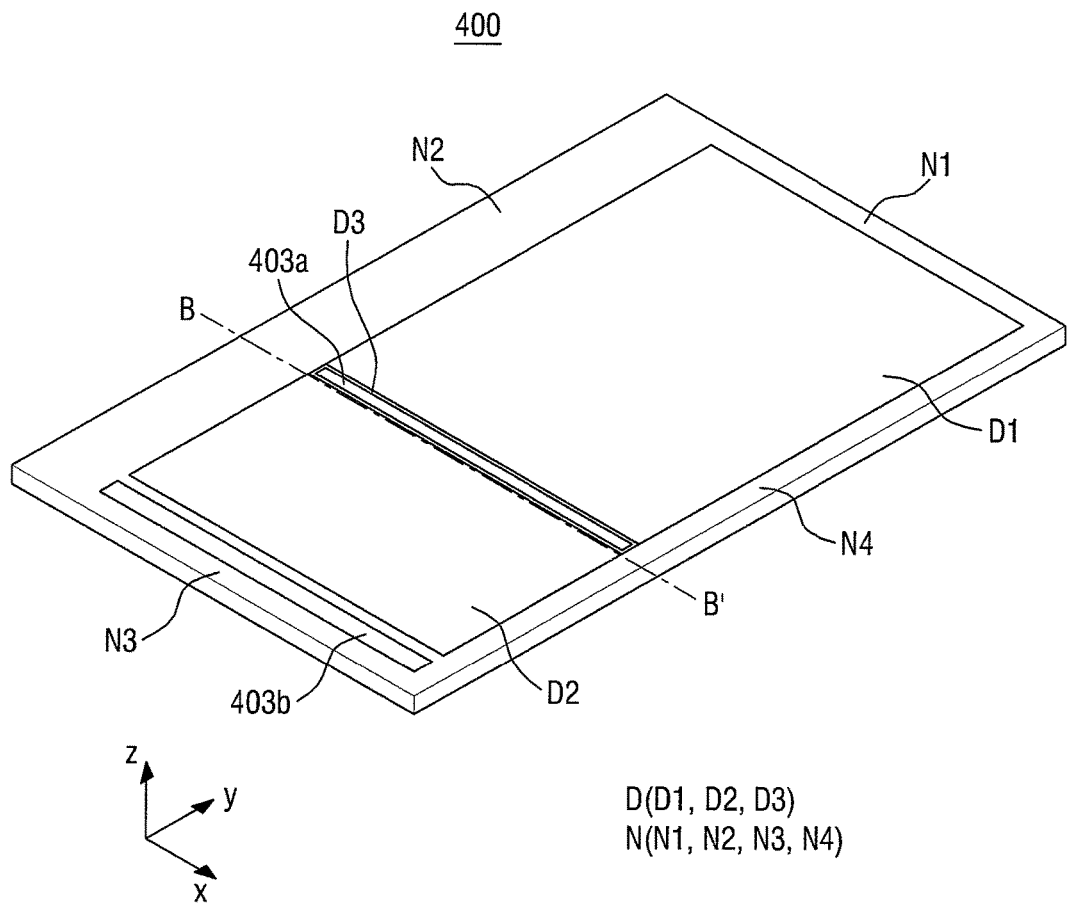
FIG. 17 is a perspective view schematically illustrating a display panel according to still another embodiment of the present invention.
Figure 18:
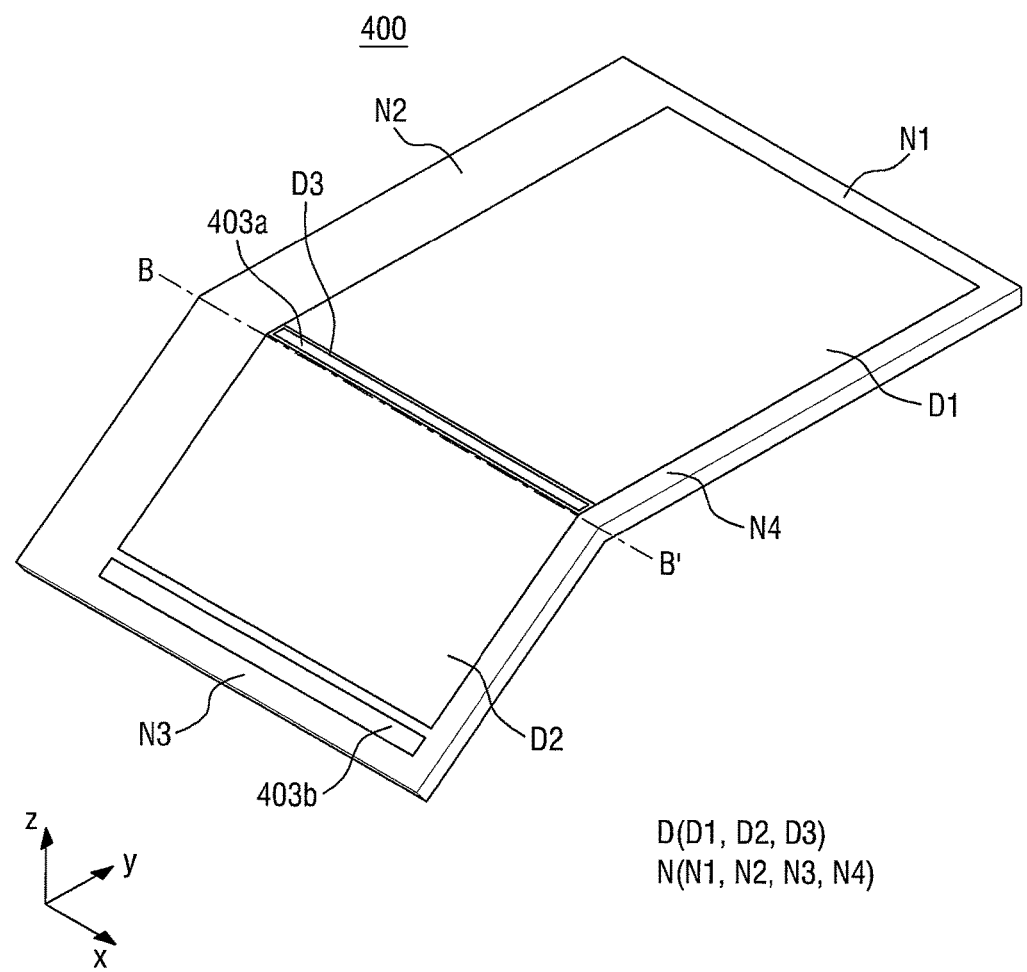
FIG. 18 is a perspective view illustrating the display panel that is bent along the line B-B' of FIG. 17.

FIG. 17 is a perspective view schematically illustrating a display panel according to still another embodiment of the present invention, and FIG. 18 is a perspective view illustrating a display panel that is bent along the line B-B' of FIG. 17.

Referring to FIGS. 17 and 18, a display panel 400 includes a display region D and a non-display region N. The display region D may include a first region D1, a second region D2, and a third region D3. The first region D1 and the second region D2 may be regions on which an image is displayed. The first region D1 may be a main display screen of the display region D, and the second region D2 may be an auxiliary display screen of the display region D but are not limited thereto.

The third region D3 may be formed between the first region D1 and the second region D2. The third region D3 may extend in a first direction X to couple one end of the first region D1 to the other end of the second region D2. The second region D2 may be positioned to continue the first region D1 through the third region D3. For example, the display region D may be arranged in the order of the second region D2, the third region D3, and the first region D1 along a second direction Y that crosses (e.g., is perpendicular to) the first direction X.

The third region D3 may be a bent region. The first region D1 and the second region D2 of the display region D may be bent along the third region D3. As illustrated in FIG. 18, the second region D2 may be bent along the bending line B-B' that is formed on one side of the third region D3. The third region D3 corresponds to a bent portion of the flexible display panel and may be an invisible region that is not recognized by a user's eye. For example, the third region D3 may correspond to a boundary surface (e.g., an interface) between the first region D1 and the second region D2 which is in a bent state and, thus, may not be easily recognized by the user's eye. Accordingly, even when one image is displayed on both the first region D1 and the second region D2 or different images are respectively displayed on the first region D1 and the second region D2, deterioration of the display quality that is caused by the third region D3 can be reduced or minimized. In this embodiment, the third region D3 may include a first drive portion 403a that drives the first region D1, and the non-display region N may include a second drive portion 403b that drives the second region D2. Hereinafter, this will be described in more detail with reference to FIGS. 19 and 20.

Figure 19:
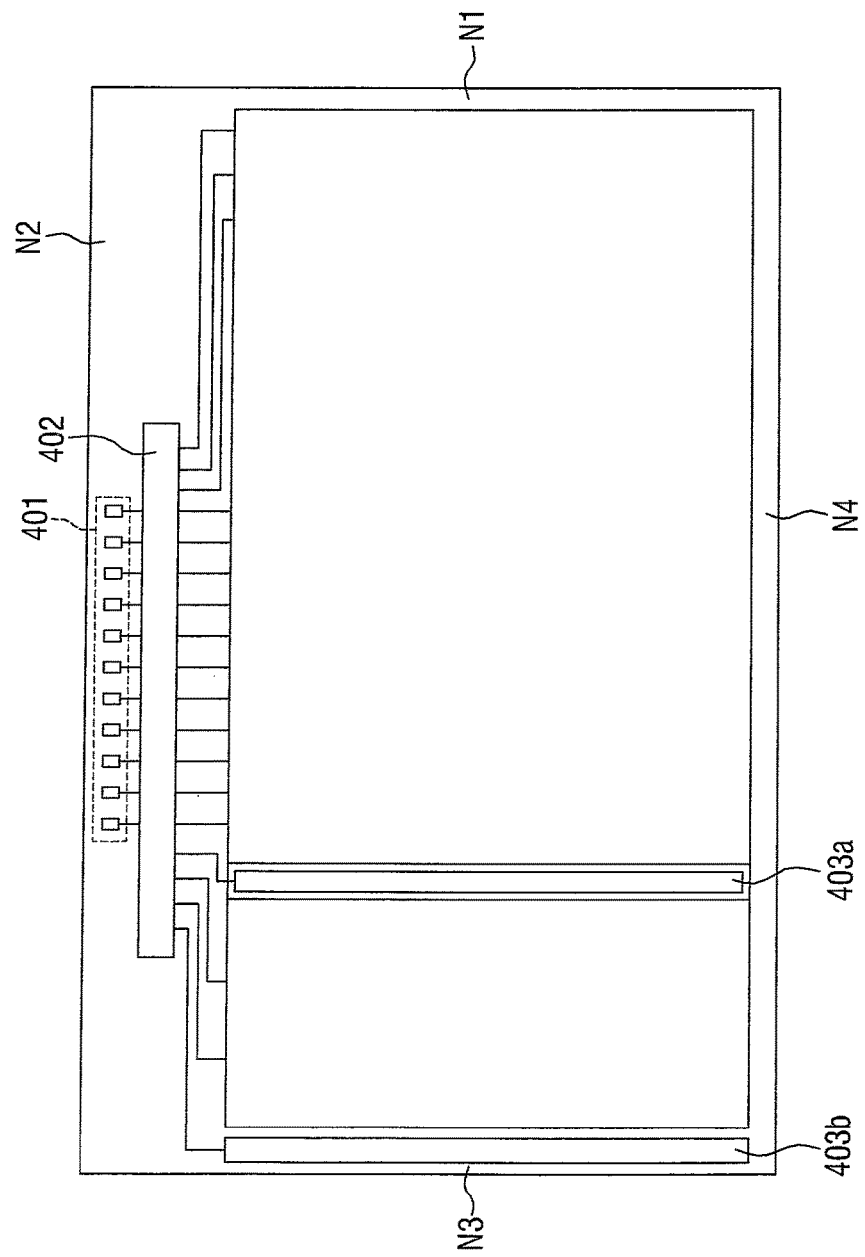
FIG. 19 is a block diagram of a display panel according to still another embodiment of the present invention.
Figure 20:
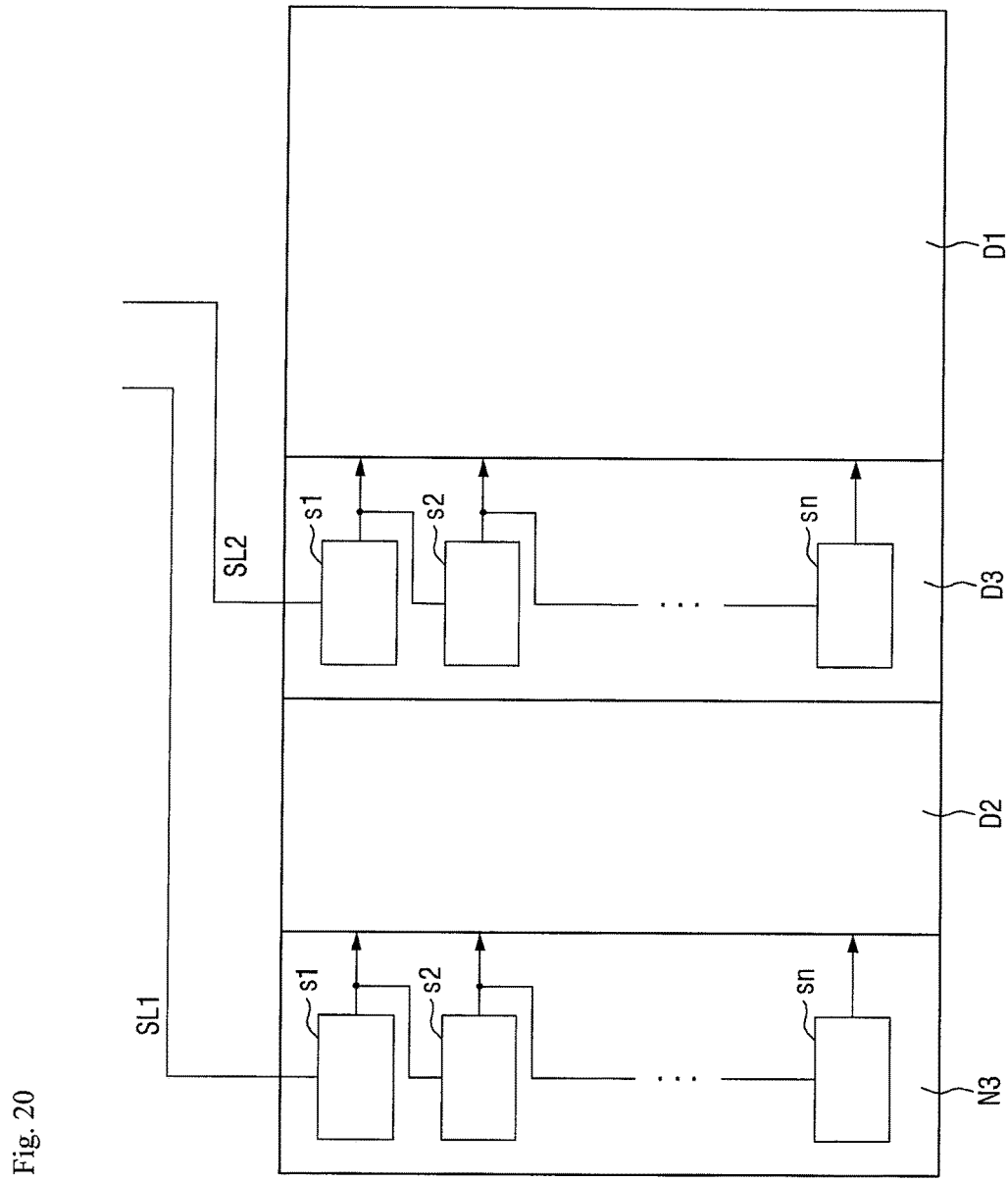
FIG. 20 is a block diagram of a scan drive portion and a display region according to still another embodiment of the present invention.

FIG. 19 is a block diagram of a display panel according to still another embodiment of the present invention, and FIG. 20 is a block diagram of a scan drive portion and a display region according to still another embodiment of the present invention.

Referring to FIGS. 19 and 20, the third region D3 may include a first drive portion 403a, and the third non-display region N3 in the non-display region N may include a second drive portion 403b. The first drive portion 403a may be a first scan drive portion that provides a scan signal to the first region D1, and the second drive portion 403b may be a second scan drive portion that provides a scan signal to the second region D2. In the display panel 400 according to still another embodiment of the present invention, because the first scan drive portion 403a that drives the first region D1 is formed on the third region D3 that is a bent region of the display region D, a relatively narrow bezel can be implemented. In addition, according to the display panel 400, because the first scan drive portion 403a is arranged between the first region D1 and the second region D2, the transmission distance of the scan signal can be shortened, and thus, attenuation of the scan signal can be reduced or prevented.

The display panel 400 according to this embodiment may further include a driver IC 402 and a pad portion 401. The driver IC 402 may be formed on the second non-display region N2 in the non-display region N and may provide data voltages to the first region D1 and the second region D2. The pad portion 401 may be formed on the second non-display region N2, and may provide a data control signal, a first scan control signal SL1, and a second scan control signal SL2 to the driver IC 402, the first scan drive portion 403a, and the second scan drive portion 403b, respectively. The formation positions of the driver IC 402 and the pad portion 401 are not limited to those as described above. In some embodiments, the driver IC 402 may be formed on the third region D3, and thus, a relatively narrow non-display region can be formed.

The first scan drive portion 403a and the second scan drive portion 403b may each include a plurality of stages s1 to sn. The plurality of stages s1 to sn of the first scan drive portion 403a may be coupled to the scan lines of the first region D1 to provide the scan signals. The plurality of stages s1 to sn of the second scan drive portion 403b may be coupled to the scan lines of the second region D2 and may provide the scan signals. The scan signals may be successively generated from the first stage s1 to the n-th stage sn and may be successively provided to the scan lines. For example, the respective stages s1 to sn may provide the generated scan signals to the next stage, and the next stage may generate the scan signal in response to the scan signals of the previous stage. However, the first stage s1 of the first scan drive portion 403a and the first stage s1 of the second drive portion 403b may output the scan signals in response to the first scan control signal SL1 and the second scan control signal SL2. For example, the driving of the first scan drive portion 403a and the second scan drive portion 403b may be controlled by the first scan control signal SL1 and the second scan control signal SL2, respectively.

The pad portion 401 may output and provide at least one of the first scan control signal SL1 and the second scan control signal SL2 to the first scan drive portion 403a and the second scan drive portion 403b. For example, the pad portion 401 may output the first scan control signal SL1 and/or the second scan control signal SL2. When only the first region D1 is driven, the pad portion 401 can output only the first scan control signal SL1, and when only the second region D2 is driven, the pad portion 401 can output only the second scan control signal SL2. When both the first region D1 and the second region D2 are driven, the pad portion 401 may provide both the first scan control signal SL1 and the second scan control signal SL2.

Because the pad portion 401 of the display panel according to this embodiment can provide a signal that can selectively drive the first region D1 and the second region D2, the power consumption can be reduced. Further, because the drive circuit mounted on the third region D3 has a simpler configuration than the drive circuit of the display panel 100 as described above, the area of the third region D3 that is a region between the first region D1 and the second region D2 can be further reduced.

Because other configurations of the display panel 400 are substantially the same or the same as those of the display panel 100 shown in FIGS. 1 to 8, the description of features that have the same reference numerals or the same names may be omitted.

Hereinafter, a display device according to an embodiment of the present invention will be described.

Figure 21:
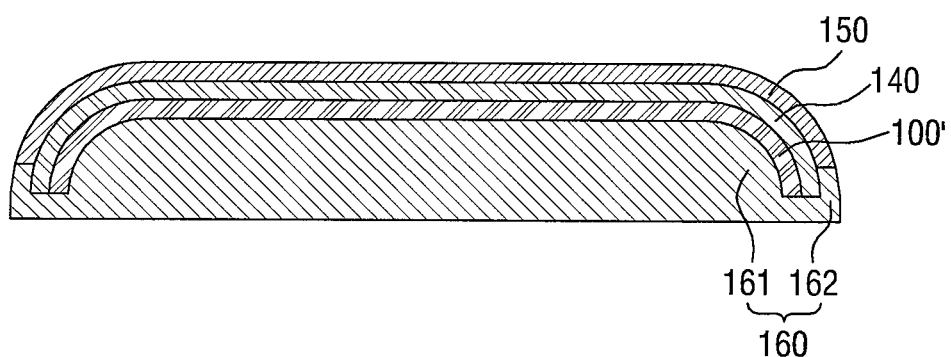
FIG. 21 is an exploded cross-sectional view of a display device according to an embodiment of the present invention.
Figure 22:
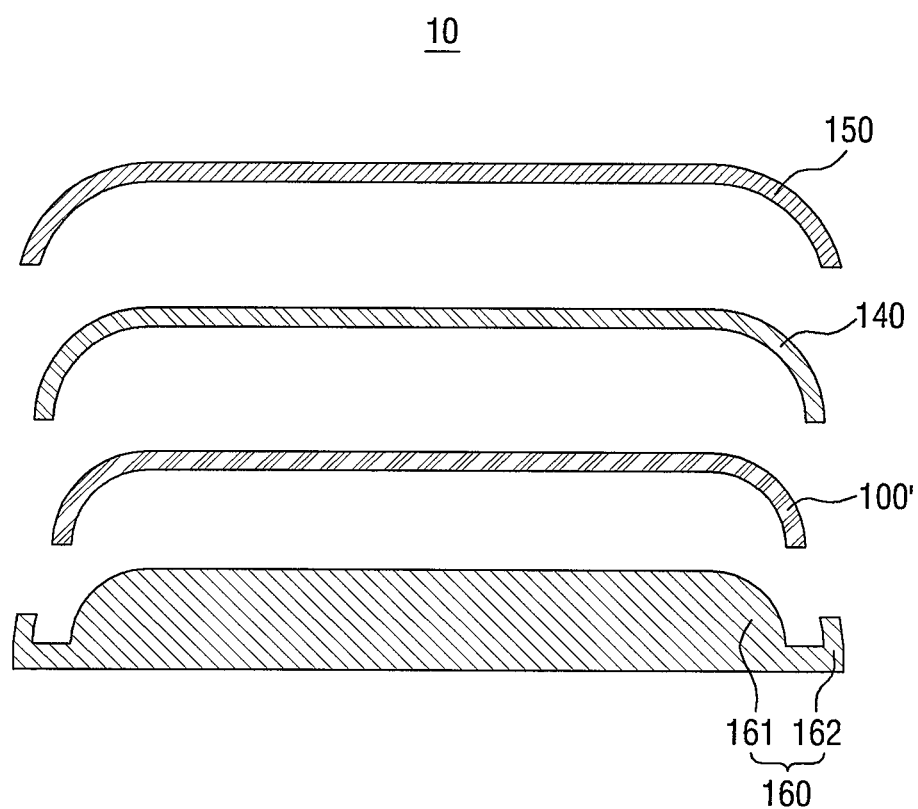
FIG. 22 is a cross-sectional view of a display device according to an embodiment of the present invention.
Figure 23:
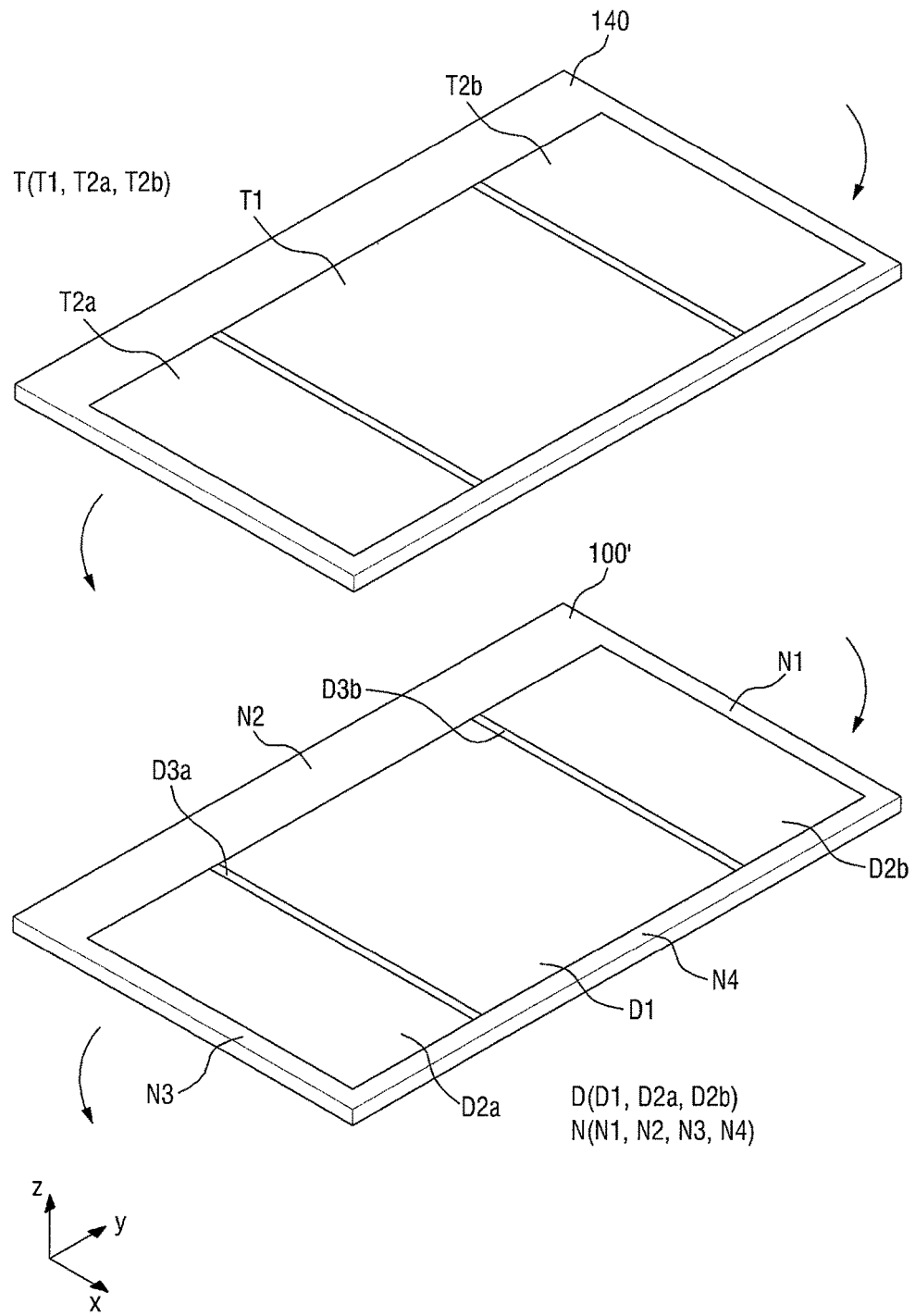
FIG. 23 is a schematic view illustrating a relationship between a display panel and a touch panel.

FIG. 21 is an exploded cross-sectional view of a display device according to an embodiment of the present invention, and FIG. 22 is a cross-sectional view of a display device according to an embodiment of the present invention. FIG. 23 is a schematic view illustrating a relationship between a display panel and a touch panel.

Referring to FIGS. 21 to 23, the display device 10 includes a display panel 100', a touch panel 140, a transparent protection window 150, and a housing 160.

Because the display panel 100' has substantially the same or the same configuration as that of the display panel 300 described above, the detailed description thereof may be omitted. However, the display panel 100' is not limited the configuration described above and may be the same or substantially the same as the display panel according to any other embodiment described above.

The touch panel 140 may be arranged on the display panel 100'. The touch panel 140 according to this embodiment may be one of various suitable touch types, such as a capacitance type or a resistance type. The touch panel 140 may be a flexible touch panel that include a flexible material and may be formed of a transparent material because it is arranged on an upper portion of the display panel 100' on which an image is displayed. The display panel 100' may include a display region D and a non-display region N that is at an outer portion of the display region D. The touch panel 140 may include a touch region T and a wiring region that is at an outer portion of the touch region T.

The display region D may include a first region D1, second regions D2a and D2b, and third regions D3a and D3b formed between the first region D1 and the second regions D2a and D2b, respectively. The first region D1 and the second regions D2a and D2b may be regions on which an image is displayed, and the third regions D3a and D3b may be bent regions on which drive portions that drive the first region D1 and the second regions D2a and D2b are formed.

The touch region T may include a first touch region T1 and second touch regions T2a and T2b. The display region D of the display panel 100' may correspond to the touch region T of the touch panel 140, and the non-display region N of the display panel 100' may correspond to the wiring region of the touch panel 140. For example, the first region D1 and the first touch region T1 may be aligned to correspond to each other, the second regions D2a and D2b and the second touch regions T2a and T2b may be aligned to respectively correspond to each other, and then the touch panel 140 and the display panel 100' my be joined to each other. Sides of the display panel 100' that is combined with the touch panel 140 may be bent along the third regions D3a and D3b. The touch panel 140 may have a gap space, which corresponds to the third regions D3a and D3b of the display panel 100', between the first touch region T1 and the second touch region T2, and the touch panel 140 may be easily bent at the gap space.

The display panel 100' may be fixed to the touch panel 140 by the transparent protection window 150 and the housing 160.

The transparent protection window 150 may be joined to an upper surface of the display panel 100' on which an image is displayed to correspond to a bent shape of the display panel 100'. That is, the transparent protection window 150 may be arranged on the touch panel 140. The display panel 100' may correspond to the shape of the touch panel 140, and one end and the other end of the transparent protection window 150 may be joined to one end and the other end of the housing 160, respectively. The transparent protection window 150 may be transparent such that the display screen of the display panel 100' is easily visible to a user through the transparent protection window 150. Further, the transparent protection window 150 may protect the display panel 100' from an external impact and scratch and may function as a support to maintain the bent shape of the display panel 100'. An adhesive layer for adhesion may be formed between the touch panel 140 and the display panel 100' and between the touch panel 140 and the transparent protection window 150.

The housing 160 may include a support portion 161 and a seat portion 162. The support portion 161 may be a space in which the display panel 100' is arranged. The support portion 161 may be configured to support the display panel 100' and to maintain the curved surface shape of the display panel 100'. The seat portion 162 may be a space in which end portions of the display panel 100' and the touch panel 140 are fixed. Further, the seat portion 162 may prevent the non-display region N of the display panel 100' and the wiring region of the touch panel from being visually recognized to an outside. One end and the other end of the housing 160 may be formed to project in an upward direction and may be combined with one end and the other end of the transparent protection window 150 as described above.

According to the display device 10 of this embodiment, the drive portion is formed in the third region D3, and thus, the non-display region is reduced to provide an extended image screen. Further, because the respective display regions can be individually driven, the power consumption can be reduced.

Exemplary embodiments of the present invention have been described for illustrative purposes, and those skilled in the art will appreciate that various modifications, additions, and substitutions are possible therein without departing from the scope and spirit of the invention as disclosed in the accompanying claims and their equivalents.

What is claimed is:

1. A display panel comprising: a flexible substrate having a first region, a second region, and a third region between the first region and the second region; a first display portion on the first region and configured to display a first image; a second display portion on the second region and configured to display a second image; a scan drive portion on the third region and configured to independently drive the first display portion and the second display portion, the scan drive portion comprising: a plurality of stages; a plurality of first transistors respectively coupled between output terminals of the stages and a plurality of scan lines in the first display portion; and a plurality of second transistors respectively coupled between the output terminals of the stages and a plurality of scan lines in the second display portion; and a scan signal control portion configured to provide a first scan selection signal to each of the first transistors and to provide a second scan selection signal to the each of the second transistors, respectively, wherein the scan drive portion is configured to provide scan signals to the first display portion via the first transistors in response to the first scan selection signal and to the second display portion via the second transistors in response to the second scan selection signal, wherein the third region comprises a bent region, and the scan drive portion is on the bent region, and wherein the first region has a planar surface and the second region has a curved shape which is bent along a curvature.

2. The display panel of claim 1, wherein the flexible substrate has a non-display region at an outer region of the first region and the second region, and wherein the display panel further comprises: a driver IC on the non-display region and configured to provide data voltages to the first display portion and the second display portion; and a pad portion configured to provide a control signal and a scan control signal to the driver IC and the scan drive portion.

3. The display panel of claim 1, wherein the first display portion and the second display portion each comprise a plurality of display elements in a matrix form, and the scan drive portion is coupled to each of the plurality of display elements to provide the scan signals thereto and further comprises a buffer portion configured to amplify the scan signals.

4. The display panel of claim 1, wherein the first region is substantially planar, and the second region has a curved surface that is bent along the curvature.

5. The display panel of claim 1, wherein the first region and the second region are substantially planar.

6. The display panel of claim 1, wherein the third region is on opposite sides of the first region, and the second region is on the opposite sides of the first region.

7. The display panel of claim 6, wherein the flexible substrate is bent such that portions of the second region face each other.

8. A display panel comprising: a substrate having a first region, a second region bent with respect to the first region, and a third region between the first region and the second region; a first display portion on the first region and configured to display a first image; a second display portion on the second region and configured to display a second image; a scan drive portion on the third region and configured to drive and to provide scan signals to the first display portion and the second display portion, respectively, the scan drive portion comprising: a plurality of stages; a plurality of first transistors respectively coupled between the stages and a plurality of scan lines in the first display portion; and a plurality of second transistors respectively coupled between the stages and a plurality of scan lines in the second display portion; and a scan signal control portion configured to provide a first scan selection signal and a second scan selection signal to the first transistors and the second transistors, respectively, wherein the scan drive portion is configured to provide the scan signals to the first display portion via the first transistors in response to the first scan selection signal and to the second display portion via the second transistors in response to the second scan selection signal.

9. The display panel of claim 8, wherein the third region is flexible.

10. The display panel of claim 9, wherein the first region and the second region are flexible.

* * * * *